US012393765B2

(12) United States Patent
Liu et al.

(10) Patent No.: US 12,393,765 B2
(45) Date of Patent: Aug. 19, 2025

(54) AUTOMATING SEARCH FOR IMPROVED DISPLAY STRUCTURE FOR UNDER-DISPLAY CAMERA SYSTEMS

(71) Applicant: Samsung Electronics Company, Ltd., Suwon-si (KR)

(72) Inventors: Changgeng Liu, San Jose, CA (US); Ernest Rehmatulla Post, San Francisco, CA (US); Kishore Rathinavel, San Jose, CA (US); Kushal Kardam Vyas, Santa Clara, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 714 days.

(21) Appl. No.: 17/745,693

(22) Filed: May 16, 2022

(65) Prior Publication Data

US 2023/0042592 A1 Feb. 9, 2023

Related U.S. Application Data

(60) Provisional application No. 63/230,423, filed on Aug. 6, 2021.

(51) Int. Cl.
*G06F 30/398* (2020.01)
*H10K 50/856* (2023.01)
*H10K 59/122* (2023.01)

(52) U.S. Cl.
CPC ......... *G06F 30/398* (2020.01); *H10K 50/856* (2023.02); *H10K 59/122* (2023.02)

(58) Field of Classification Search
CPC ... G06F 30/398; H10K 59/122; H10K 50/856
(Continued)

(56) References Cited

U.S. PATENT DOCUMENTS 3,971,065 A 7/1976 Bayer
6,454,414 B1 9/2002 Ting
(Continued)

FOREIGN PATENT DOCUMENTS

CN 101414094 A 4/2009
CN 107220945 A 9/2017
(Continued)

OTHER PUBLICATIONS

International Search Report and Written Opinion for International Application No. PCT/KR2023/017304, Feb. 2, 2024.
(Continued)

*Primary Examiner* — Jack Chiang
*Assistant Examiner* — Suchin Parihar

(57) ABSTRACT

A method includes accessing a display structure for manufacturing a display panel for an under-display camera (UDC) system. The method further includes computing a point spread function (PSF) of the UDC system with the display structure and computing a metric to evaluate performance of the display structure based on the PSF. The method further includes determining that the metric does not satisfy selection criteria for using the display structure for manufacturing the display panel for the UDC system and in response to the determination, iteratively optimizing the display structure, using an automated searching process, until the metric satisfies the selection criteria. The method further includes generating an optimized display structure responsive to completion of the automated searching process. The optimized display structure is used for manufacturing the display panel for the UDC system.

20 Claims, 20 Drawing Sheets

(58) Field of Classification Search
USPC .......................................................... 716/54
See application file for complete search history.

(56) References Cited

U.S. PATENT DOCUMENTS

| | | | |
|---|---|---|---|
| 7,053,613 B2 | 5/2006 | Lin | |
| 8,041,142 B2 | 10/2011 | Schafer | |
| 8,294,999 B2* | 10/2012 | Alon | H04N 25/61 |
| | | | 359/896 |
| 8,433,152 B2 | 4/2013 | Watanabe | |
| 8,582,911 B2 | 11/2013 | Kim | |
| 8,587,703 B2 | 11/2013 | Lelescu | |
| 9,220,481 B2 | 12/2015 | Park | |
| 9,338,354 B2 | 5/2016 | Hong | |
| 9,350,977 B1* | 5/2016 | Prasad | H04N 13/204 |
| 9,582,862 B2 | 2/2017 | Zhang | |
| 9,654,707 B2 | 5/2017 | Oniki | |
| 9,911,208 B2 | 3/2018 | Zhou | |
| 9,916,656 B2 | 3/2018 | Choi | |
| 9,947,901 B2 | 4/2018 | Shedletsky | |
| 9,948,849 B2 | 4/2018 | Kim | |
| 10,032,254 B2 | 7/2018 | Harmeling | |
| 10,062,153 B2 | 8/2018 | Oniki | |
| 10,083,335 B2 | 9/2018 | Zhang | |
| 10,151,933 B2 | 12/2018 | Siddiqui | |
| 10,178,381 B2* | 1/2019 | Hall | H04N 17/002 |
| 10,191,577 B2 | 1/2019 | Choi | |
| 10,217,190 B2 | 2/2019 | Liu | |
| 10,416,087 B2 | 9/2019 | Zhang | |
| 10,595,724 B2 | 3/2020 | Lai | |
| 10,642,059 B2 | 5/2020 | Soskind | |
| 10,656,437 B2 | 5/2020 | Limon | |
| 11,003,088 B2 | 5/2021 | Sorg | |
| 11,038,143 B2 | 6/2021 | Moon | |
| 11,073,712 B2 | 7/2021 | Yeke Yazdandoost | |
| 11,272,106 B1 | 3/2022 | Lee | |
| 11,368,617 B2* | 6/2022 | Zhou | G06V 10/764 |
| 11,575,865 B2 | 2/2023 | Liu | |
| 11,721,001 B2 | 8/2023 | Liu | |
| 11,792,515 B2 | 10/2023 | Lee | |
| 11,893,482 B2* | 2/2024 | Zhou | H04N 23/90 |
| 2003/0002746 A1 | 1/2003 | Kusaka | |
| 2006/0103951 A1 | 5/2006 | Bell | |
| 2006/0256226 A1 | 11/2006 | Alon | |
| 2007/0239417 A1* | 10/2007 | Alon | H04N 17/002 |
| | | | 348/207.99 |
| 2008/0013850 A1 | 1/2008 | Sakurai | |
| 2008/0068660 A1 | 3/2008 | Lace | |
| 2008/0165261 A1 | 7/2008 | Kamo | |
| 2008/0166115 A1 | 7/2008 | Sachs | |
| 2008/0218597 A1 | 9/2008 | Cho | |
| 2008/0292135 A1 | 11/2008 | Schafer | |
| 2009/0147111 A1 | 6/2009 | Litvinov | |
| 2009/0263043 A1 | 10/2009 | Cristobal | |
| 2010/0073518 A1 | 3/2010 | Yeh | |
| 2010/0188528 A1 | 7/2010 | Iwata | |
| 2011/0019056 A1 | 1/2011 | Hirsch | |
| 2011/0075257 A1 | 3/2011 | Hua | |
| 2011/0158541 A1 | 6/2011 | Watanabe | |
| 2011/0221888 A1 | 9/2011 | Choi | |
| 2011/0285680 A1 | 11/2011 | Nakamura | |
| 2012/0057072 A1 | 3/2012 | Yamashita | |
| 2012/0162490 A1 | 6/2012 | Chung | |
| 2012/0327277 A1 | 12/2012 | Myhrvold | |
| 2013/0002932 A1 | 1/2013 | Guenter | |
| 2013/0010077 A1 | 1/2013 | Nguyen | |
| 2013/0147778 A1 | 6/2013 | Ninan | |
| 2013/0182062 A1 | 7/2013 | Son | |
| 2013/0308007 A1 | 11/2013 | Tanaka | |
| 2013/0321686 A1 | 12/2013 | Tan | |
| 2013/0336597 A1 | 12/2013 | Maeda | |
| 2014/0044314 A1 | 2/2014 | Sezer | |
| 2015/0049165 A1 | 2/2015 | Choi | |
| 2015/0101411 A1 | 4/2015 | Zalev | |
| 2015/0207962 A1 | 7/2015 | Sugimoto | |
| 2015/0269434 A1* | 9/2015 | Aliaga | G06T 5/00 |
| | | | 382/114 |
| 2015/0338639 A1 | 11/2015 | Mtsumoto | |
| 2016/0062100 A1 | 3/2016 | Cohen | |
| 2016/0180510 A1 | 6/2016 | Grau | |
| 2016/0248975 A1 | 8/2016 | Choi | |
| 2016/0277658 A1 | 9/2016 | Kim | |
| 2016/0371821 A1 | 12/2016 | Hayashi | |
| 2017/0076430 A1 | 3/2017 | Xu | |
| 2017/0104897 A1 | 4/2017 | Kang | |
| 2017/0212613 A1 | 7/2017 | Hwang | |
| 2017/0316552 A1 | 11/2017 | Hanocka | |
| 2018/0038768 A1 | 2/2018 | Hofmann | |
| 2018/0052050 A1 | 2/2018 | Menon | |
| 2018/0116500 A1 | 5/2018 | Escalier | |
| 2018/0129061 A1 | 5/2018 | Shinohara | |
| 2018/0198980 A1 | 7/2018 | Takagi | |
| 2018/0211420 A1 | 7/2018 | Yoo | |
| 2019/0212544 A1 | 7/2019 | Heber | |
| 2019/0213717 A1 | 7/2019 | Oniki | |
| 2019/0327417 A1 | 10/2019 | Moriuchi | |
| 2019/0355101 A1 | 11/2019 | Chen | |
| 2020/0159102 A1 | 5/2020 | Kouyama | |
| 2020/0166807 A1 | 5/2020 | Sasaki | |
| 2020/0169725 A1 | 5/2020 | Hua | |
| 2020/0209604 A1 | 7/2020 | Chen | |
| 2020/0321561 A1 | 10/2020 | Park | |
| 2020/0389575 A1* | 12/2020 | Gove | H04N 13/271 |
| 2020/0394964 A1 | 12/2020 | Hyun | |
| 2021/0029336 A1* | 1/2021 | Liu | H04N 25/615 |
| 2021/0136335 A1 | 5/2021 | Tanaka | |
| 2021/0152735 A1* | 5/2021 | Zhou | G06N 3/08 |
| 2021/0193756 A1 | 6/2021 | Oh | |
| 2021/0199952 A1 | 7/2021 | Cho | |
| 2021/0210533 A1 | 7/2021 | Cho | |
| 2021/0233976 A1 | 7/2021 | Lee | |
| 2021/0302316 A1 | 9/2021 | Walter | |
| 2022/0067889 A1 | 3/2022 | Kang | |
| 2022/0086309 A1 | 3/2022 | Kim | |
| 2022/0138924 A1 | 5/2022 | Kwon | |
| 2022/0261966 A1 | 8/2022 | Liu | |
| 2022/0277426 A1 | 9/2022 | Vyas | |
| 2022/0292637 A1 | 9/2022 | Huang | |
| 2022/0398698 A1* | 12/2022 | Li | G06N 3/09 |
| 2023/0053084 A1* | 2/2023 | Xu | G06T 5/73 |
| 2023/0341264 A1 | 10/2023 | Houck | |

FOREIGN PATENT DOCUMENTS

| | | |
|---|---|---|
| CN | 111 681 560 A | 9/2020 |
| CN | 112202991 A | 1/2021 |
| CN | 113 053 253 A | 6/2021 |
| CN | 113 067 961 A | 7/2021 |
| CN | 108335268 B | 9/2021 |
| CN | 114331886 A | 4/2022 |
| CN | 110675347 B | 5/2022 |
| JP | 2008-070566 A | 3/2008 |
| JP | 2019-068378 A | 4/2019 |
| JP | 6652052 B9 | 2/2020 |
| KR | 101894391 B1 | 9/2018 |
| KR | 10-2022-0014764 A | 2/2022 |
| WO | WO 2010081229 A1 | 7/2010 |
| WO | WO 2016-154392 A1 | 9/2016 |
| WO | WO 2017117152 A1 | 7/2017 |
| WO | W02021-122471 A1 | 6/2021 |
| WO | WO 2022-005157 A1 | 1/2022 |

OTHER PUBLICATIONS

Yangjie Wei et al., Blurring kernel extraction and super-resolution image reconstruction based on style generative adersarial networks, Optics Express vol. 29, Issue 26, Dec. 16, 2021.

Eric Yang, Variable Synthetic Depth of Field with Mobile Stereo Cameras, Computer Science Engineering, https://stanford.edu/class/ee367/sections 3.2, 4.3; 2020, retrieved on Jan. 9, 2024.

"Oppo's under-screen camera is real and taking photos in Shanghai," Richard Lai, https://www.engadget.com/2019-06-26-oppo-under-screen-camera-mwc-shanghai.html, Jun. 26, 2019.

(56) References Cited

OTHER PUBLICATIONS

Anqi Yang et al., 'Designing Display Pixel Layouts for Under-Panel Cameras', IEEE Transactions on Pattern Analysis and Machine Intelligence, vol. 43, No. 7, pp. 2245-2256, Apr. 27, 2021.

Yuqian Zhou et al., 'Image Restoration for Under-Display Camera', arXiv:2003.04857v1, pp. 1-17, Mar. 2020.

PCT Search Report and Written Decision in PCT/KR2022/011598, Nov. 16, 2022.

PCT Search Report and Written Decision in PCT/KR2022/001920, May 13, 2022.

Non-Final Office Action in U.S. Appl. No. 17/176,535, Aug. 16, 2022.

Final Office Action in U.S. Appl. No. 17/176,535, Nov. 7, 2022.

Notice of Allowance in U.S. Appl. No. 17/963,609, Aug. 28, 2024.

Non-final Office Action in U.S. Appl. No. 17/963,609, Mar. 27, 2024.

Non-final office action in U.S. Appl. No. 17/993,357, Feb. 12, 2025.

Levin, A. et al., "Image and Depth from a Conventional Camera with a Coded Aperture," ACM Transactions on Graphics, vol. 26, No. 3, Article 70, Publication date Jul. 2007, DOI 10.1145/1239451.1239952, http://doi.acm.org/10.1145/1239451.1239521, 9 pgs.

Hong, J., et al., "Three-dimensional display technologies of recent interest: principles, status, and issues [Invited]," (Doc. ID 152226), Applied Optics, vol. 50, No. 34, , Dec. 1, 2011, https://www.researchgate.net/publication/51919272, DOI: 10.1364/AO.50.000H87, 0003-6935/11/340H87, © 2011 Optical Society of America, pp. H87-H115 (30 pages), Dec. 1, 2011.

Ren, Ng, "Digital light field photography," PhD dissertation, Stanford University, Jul. 2006, 203 pgs.

Qin, Zong, et al., "See-Through Image Blurring of Transparent Organic Light-Emitting Diodes Display: Calculation Method Based on Diffraction and Analysis of Pixel Structures," Journal of Display Technology, vol. 12, No. 11, Nov. 2016, Digital Object Identifier 10.1109/JDT.2016.2594815, 1551-319X © 2016 IEEE, pp. 1242-1249 (9 pgs).

Richardson, William Hadley, "Bayesian-Based Iterative Method of Image Restoration," Journal of Optical Society of America, vol. 62, No. 1, Jan. 1972, pp. 55-59 (5 pgs).

Lucy, L. B., "An Iterative Technique for the Rectification of Observed Distributions," The Astronomical Journal, vol. 79, No. 6, Jun. 1974, © American Astronomical Society, provided by the NASA Astrophysics Data System, pp. 745-754 (10 pgs).

Heide, Felix, et al., "ProxImaL: Efficient Image Optimization Using Proximal Algorithms," SIGGRAPH 16 Technical paper, Jul. 24-28, 2016, Anaheim, CA. SIGGRAPH '16 Technical Paper, Jul. 24-28, 2016, Anaheim, CA, ISBN: 978-1-4503-4279-7/16/07 DOI: http://dx.doi.org/10.1145/2897824.2925875, 15 pages.

Sitzmann, Vincent., et al., "End-to-End Optimization of Optics and Image Processing for Achromatic Extended Depth of Field and Super-Resolution Imaging," © 2018 ACM 0730-0301/2018/8-ART114, https://doi.org/10.1145/3197517.3201333, ACM Transactions on Graphics vol. 37, No. 4, Article 114, Publication Aug. 2018, pp. 114:1-114:13 (13 pgs.).

International Search Report and Written Opinion for International App. No. PCT/KR2020/009807, Oct. 26, 2020.

European Search Report in EP 20846484.2, Mar. 14, 2022.

Non-Final Office Action in U.S. Appl. No. 16/935,946, Apr. 5, 2022.

Notice of Allowance in U.S. Appl. No. 16/935,946, Jul. 6, 2022.

Notice of Allowance in U.S. Appl. No. 16/935,946, Sep. 30, 2022.

Yang, Hang, Zhongbo Zhang, and Yujing Guan. "An adaptive parameter estimation for guided filter based image deconvolution." Signal Processing 138 (2017): 16-26, Mar. 7, 2017.

Youmaran, R., and A. Adler. "Combining regularization frameworks for image deblurring: optimization of combined hyper-parameters." In Canadian Conference on Electrical and Computer Engineering 2004 (IEEE Cat. No. 04CH37513), vol. 2, pp. 723-726. IEEE, May 2, 2004.

Non-Final Office Action in U.S. Appl. No. 17/380,995, Jun. 22, 2022.

PCT Search Report and written decision in PCT/KR2022/001024, May 10, 2022.

Notice of Allowance in U.S. Appl. No. 17/380,995, Dec. 21, 2022.

Soldevila F et al: "Phase imaging by spatial wavefront sampling", arxiv.org, Cornell University Library, 201 Olin Library Cornell University Ithaca, NY 14853, Nov. 11, 2017 (Nov. 11, 2017), XP081287443, DOI: 10.1364/OPTICA.5.000164.

Katkovnik Vladimir et al: "A novel binary and multilevel phase masks for enhanced depth-of-focus infrared imaging", 2018 52nd Asilomar Conference on Signals, Systems, and Computers, IEEE, Oct. 28, 2018 (Oct. 28, 2018), pp. 386-390, XP033520926, DOI: 10.1109/ACSSC.2018.8645129.

European Patent Office Extended European Search Report in Application No. 22881419.0-1207/4327058 PCT/KR2022015641, Sep. 19, 2024.

International Search Report and Written Opinion for International Application No. PCT/KR2023/007313, Aug. 30, 2023.

Notice of Allowance in U.S. Appl. No. 17/176,535, Mar. 8, 2023.

PCT Search Report and Written Opinion in PCT/KR2022/015641, Jan. 26, 2023.

Extended European Search Report in Application No. 22853505.0-1211 / 4363929 PCT/KR2022011598, Dec. 18, 2024.

Lin Rong Jie et al.: "An Optimized Algorithm to Reconstruct the Structure of Transparent OLED Display Based on Monte Carlo Method", SID Symposium Digest of Technical Papers, vol. 51, No. 1, Aug. 1, 2020, pp. 2009-2012, XP093230962, US ISSN:0097-966X, DOI: 10.1002/sdtp.14309.

Notice of Allowance in U.S. Appl. No. 17/993,357, Jul. 7, 2025.

\* cited by examiner

AUTOMATING SEARCH FOR IMPROVED DISPLAY STRUCTURE FOR UNDER-DISPLAY CAMERA SYSTEMS

PRIORITY

This application claims the benefit, under 35 U.S.C. § 119(e), of U.S. Provisional Patent Application No. 63/230,423, filed 6 Aug. 2021, which is incorporated herein by reference.

TECHNICAL FIELD

This disclosure relates generally to electronic displays, and, more particularly, to optimizing a display structure for use with an under-display camera (UDC) system.

BACKGROUND

Electronic displays, such as active matrix liquid crystal displays (AMLCDs), active matrix organic light emitting displays (AMOLEDs), and micro-LED displays are typically the types of displays that are deployed for use in personal electronic devices (e.g., mobile phones, tablet computers, smartwatches, and so forth). Such personal electronic devices may generally include a front-facing camera, which may be disposed adjacent to the display, and may be utilized most often by users to capture self-portraits (e.g., "selfies"). However, as front-facing camera systems grow in complexity (e.g., depth cameras), more and more of the area designated for the display of the electronic device may be traded off to expand the area designated for the camera system. This may lead to a reduction in resolution and viewing area of the display. One technique to overcome the reduction in resolution and viewing area of the display may be to dispose the front-facing camera system completely behind or underneath the display panel. However, disposing the front-facing camera system behind the display panel may often degrade images captured by the front-facing camera. Also, a display structure (e.g., back mask layer or reflective layer of OLED display) that is used for manufacturing the display panel for such UDC system (i.e., camera system behind the display panel) may have a direct impact on image quality that is achieved through the UDC system. The traditional way of finding or optimizing a display structure for the UDC system is not only manual and time consuming but also hard to find an improved one. As such, there is a need for a method for automatically searching for an improved display structure for the UDC systems.

DESCRIPTION OF EXAMPLE EMBODIMENTS

System Overview

In an under-display camera (UDC) system (also sometimes interchangeably referred to herein as camera behind or underneath display panel), a camera is put behind a semi-transparent portion of the display panel to acquire an image of an object in the real world. One example of such UDC system is shown in FIGS. 1A-1B and 2A-2B. A display structure (also sometimes interchangeably referred to herein as a display mask) that is used for manufacturing the display panel for such UDC system plays a dominating role in the determination of the optical performance of the system. For instance, the display structure may have a direct impact on image quality that is achieved through the UDC system.

Figure 4:
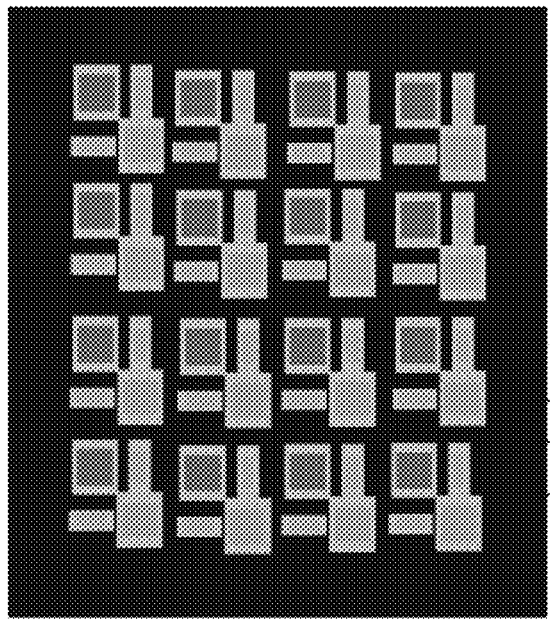
FIG. 4 illustrates a front view and section view of a standard organic light emitting diode (OLED) display structure.
Figure 4:
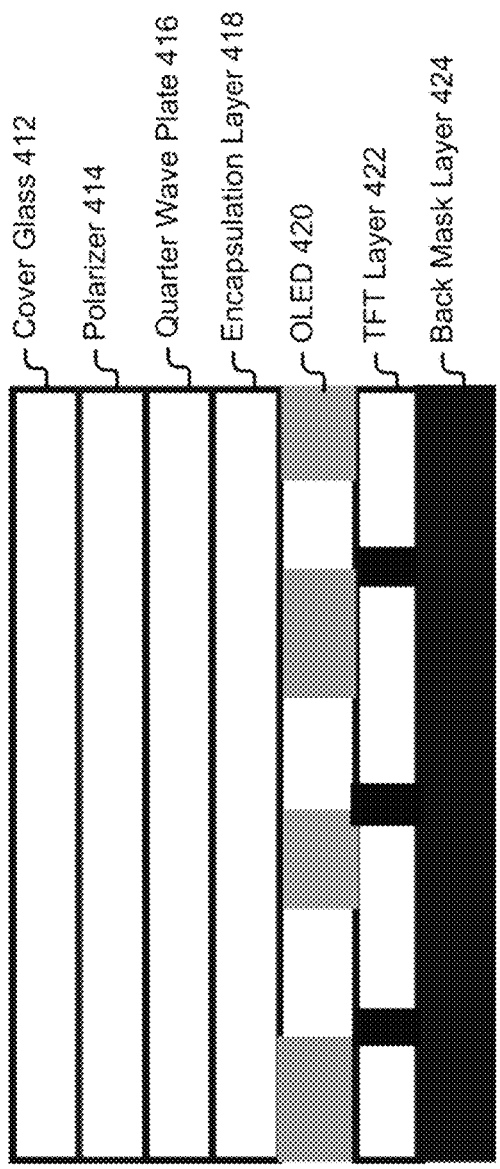
Figure 5A:
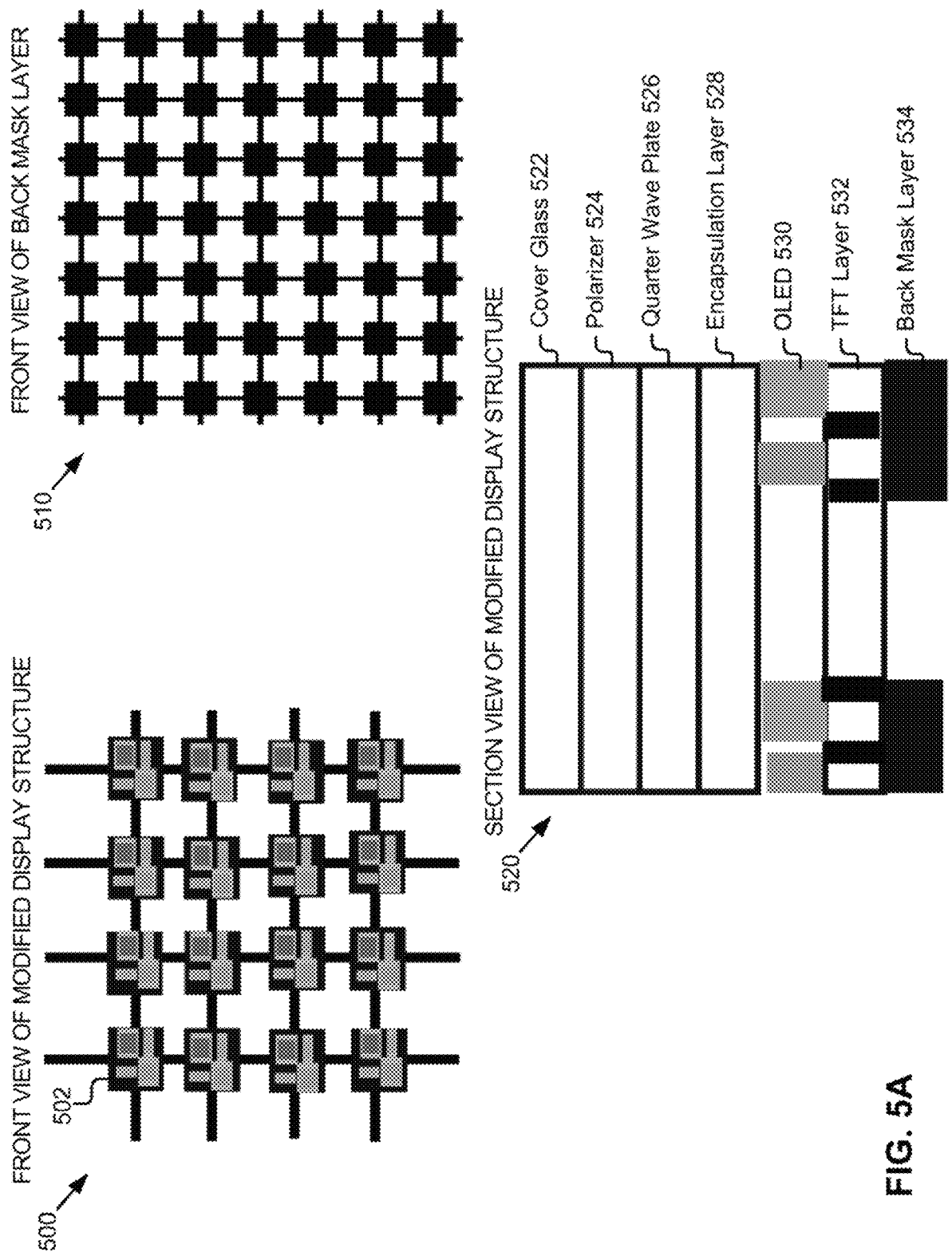
FIGS. 5A-5B illustrate two example strategies for redesigning a display structure for an under-display camera (UDC) system.
Figure 5B:
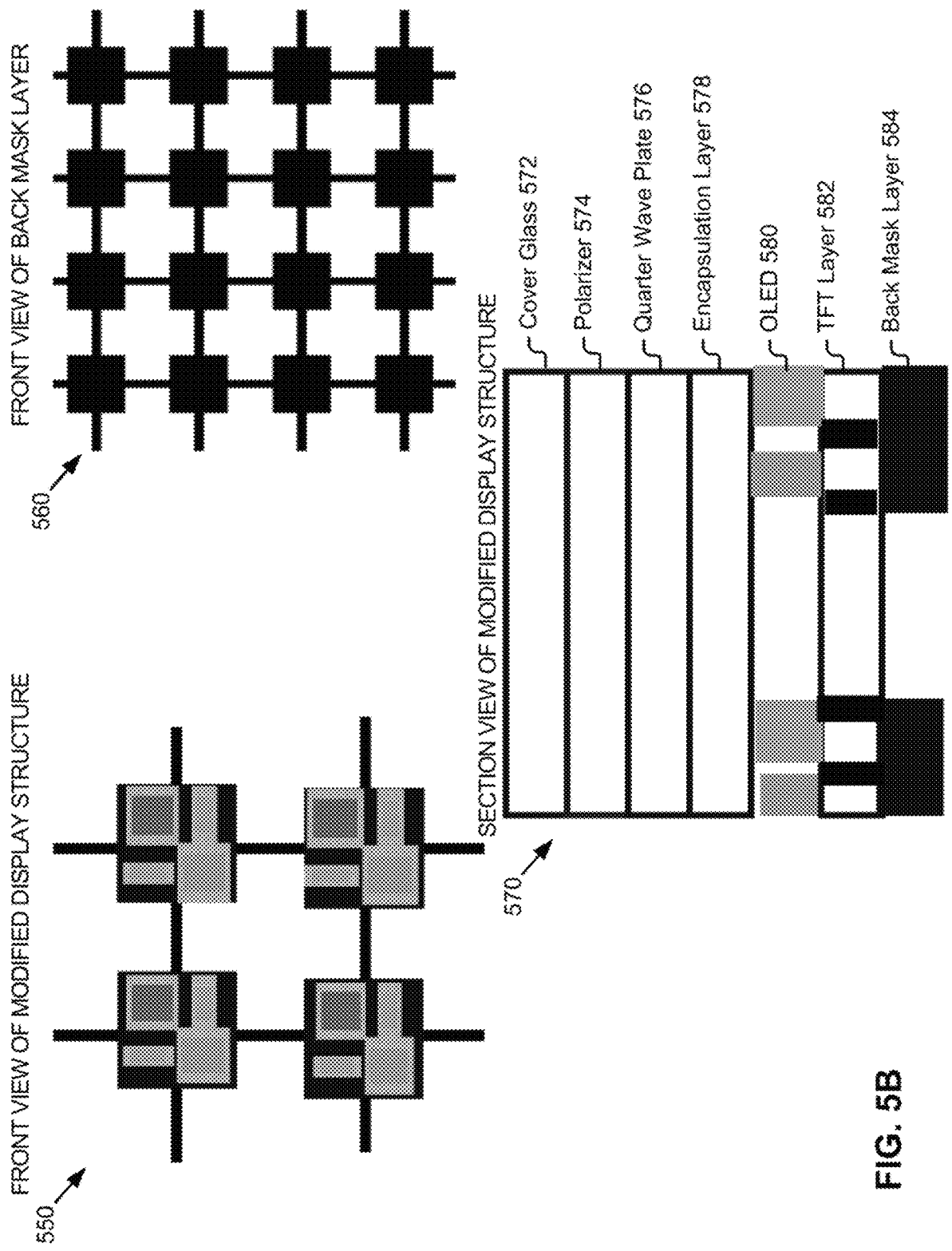

In particular embodiments, the display structure referred herein is the bottom most layer (e.g., back mask layer or reflection layer) of the display panel, such as an organic light-emitting diode (OLED) display, as shown in FIGS. 4 and 5A-5B. Since the bottom layer of the standard OLED display is mostly opaque, as shown in FIG. 4, to take an image through the OLED display, the display structure may need to be modified to enhance the transmittance. To search for an improved display structure for use with the UDC system, traditional method or way is to modify the display structure manually and intuitively and then test the performance by experience. This traditional method of finding a display structure is not only time-consuming but also hard to find an improved one. Particular embodiments discussed herein describe an improved method of automatically searching for an improved display structure by use of a computing device, such as a desktop, laptop, etc. This improved method may significantly facilitate display structure design to achieve better performance of the UDC system.

Figure 1A:
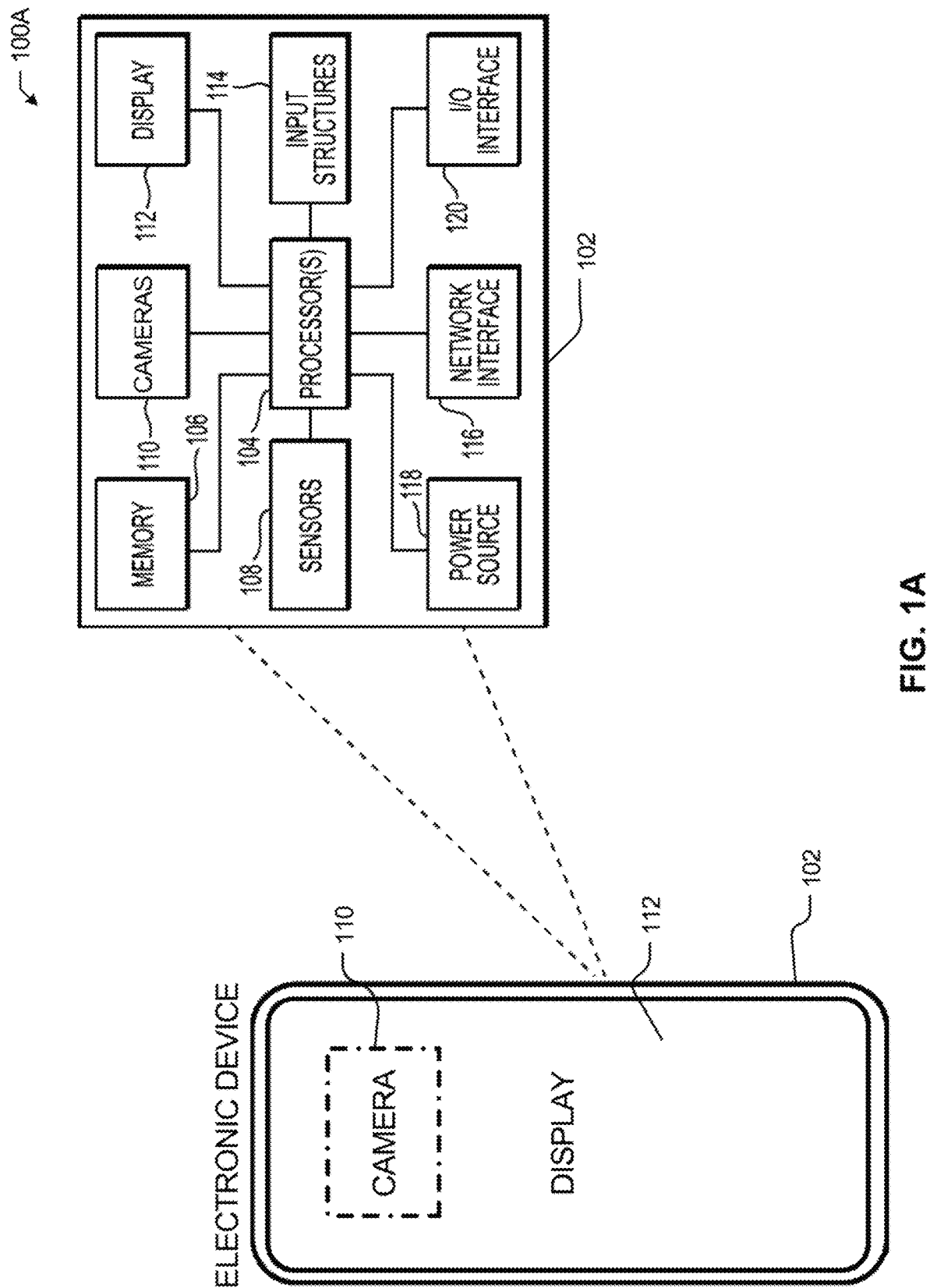
FIG. 1A illustrates an example diagram of an electronic device.

FIG. 1A illustrates an example diagram 100A of an electronic device 102. In particular embodiments, the electronic device 102 represents the UDC system discussed herein. The electronic device 102 may include, for example, any of various personal electronic devices 102, such as a mobile phone electronic device, a tablet computer electronic device, a laptop computer electronic device, and so forth. In particular embodiments, as further depicted by FIG. 1A, the personal electronic device 102 may include, among other things, one or more processor(s) 104, memory 106, sensors 108, cameras 110, a display panel 112, input structures 114, network interfaces 116, a power source 118, and an input/output (I/O) interface 120. It should be noted that FIG. 1A is merely one example of a particular implementation and is intended to illustrate the types of components that may be included as part of the electronic device 102.

In particular embodiments, the one or more processor(s) 104 may be operably coupled with the memory 106 to perform various algorithms for providing interactive music conducting and composing activity through intelligence-based learning progression. Such programs or instructions executed by the processor(s) 104 may be stored in any suitable article of manufacture that includes one or more tangible, computer-readable media at least collectively storing the instructions or routines, such as the memory 106. The memory 106 may include any suitable articles of manufacture for storing data and executable instructions, such as random-access memory (RAM), read-only memory (ROM), rewritable flash memory, hard drives, and so forth. Also, programs (e.g., an operating system) encoded on such a computer program product may also include instructions that may be executed by the processor(s) 104 to enable the electronic device 102 to provide various functionalities.

In particular embodiments, the sensors 108 may include, for example, one or more cameras (e.g., depth cameras), touch sensors, microphones, motion detection sensors, thermal detection sensors, light detection sensors, time of flight (ToF) sensors, ultrasonic sensors, infrared sensors, or other similar sensors that may be utilized to detect various user inputs (e.g., user voice inputs, user gesture inputs, user touch inputs, user instrument inputs, user motion inputs, and so forth).

The cameras 110 may include any number of cameras (e.g., wide cameras, narrow cameras, telephoto cameras, ultra-wide cameras, depth cameras, and so forth) that may be utilized to capture various 2D and 3D images. The display panel 112 may include any display architecture (e.g., AMLCD, AMOLED, micro-LED, and so forth), which may provide further means by which users may interact and engage with the electronic device 102. In particular embodiments, as further illustrated by FIG. 1, one or more of the cameras 110 may be disposed behind or underneath (e.g., as indicated by the dashed lines of electronic device 102) the display panel 112 (e.g., one or more of the cameras 110 may be completely concealed by the display panel 112), and thus the display panel 112 may include a transparent pixel region and/or semi-transparent pixel region through which the one or more concealed cameras 110 may detect light, and, by extension, capture images. It should be appreciated that the one or more of the cameras 110 may be disposed anywhere behind or underneath the display panel 112, such as at a center area behind the display panel 112, at an upper area behind the display panel 112, or at a lower area behind the display panel 112.

In particular embodiments, the input structures 114 may include any physical structures utilized to control one or more global functions of the electronic device 102 (e.g., pressing a button to power "ON" or power "OFF" the electronic device 102). The network interface 116 may include, for example, any number of network interfaces suitable for allowing the electronic device 102 to access and receive data over one or more cloud-based networks (e.g., a cloud-based service that may service hundreds or thousands of the electronic device 102 and the associated users corresponding thereto) and/or distributed networks. The power source 118 may include any suitable source of power, such as a rechargeable lithium polymer (Li-poly) battery and/or an alternating current (AC) power converter that may be utilized to power and/or charge the electronic device 102 for operation. Similarly, the I/O interface 120 may be provided to allow the electronic device 102 to interface with various other electronic or computing devices, such as one or more auxiliary electronic devices.

Figure 1B:
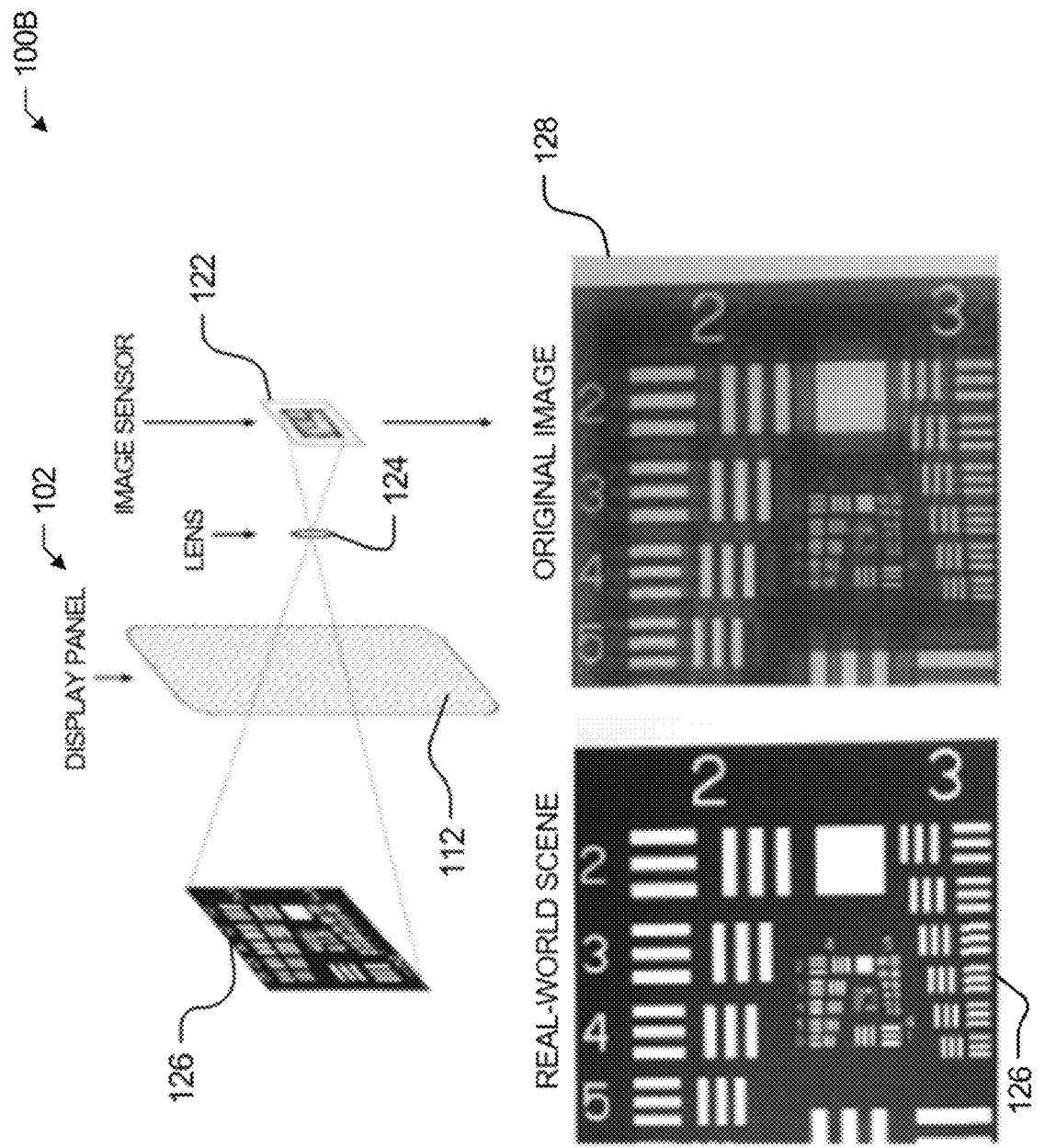
FIG. 1B illustrates an example system for images captured by a camera disposed behind a display of an electronic device.

FIG. 1B illustrates an example system 100B for images captured by a camera disposed behind a display of an electronic device, in accordance with the presently disclosed embodiments. In particular embodiments, the electronic device 102 may capture, by an image sensor 122 and camera lens 124 disposed behind a display panel 112 of the electronic device 102, an image of a real-world scene 126. In particular embodiments, the image of the real-world scene 126 captured by the image sensor 122 may correspond to an original image 128. In particular embodiments, based on the image of the real-world scene 126 being captured by the image sensor 122 through the display panel 112, the original image 128 may be degraded (e.g., blurred or distorted). In particular embodiments, after performing the capturing of the original image 128, the electronic device 102 may measure, for one or more pixel regions of the original image 128, point spread functions (PSFs) (e.g., a function of 3D diffraction pattern of light emitted from an imperceptibly small point light source and captured by one or more image sensors 122) for each of the RGB color components of the original image 128. The measured PSFs may indicate image quality per different display structures.

Figure 2A:
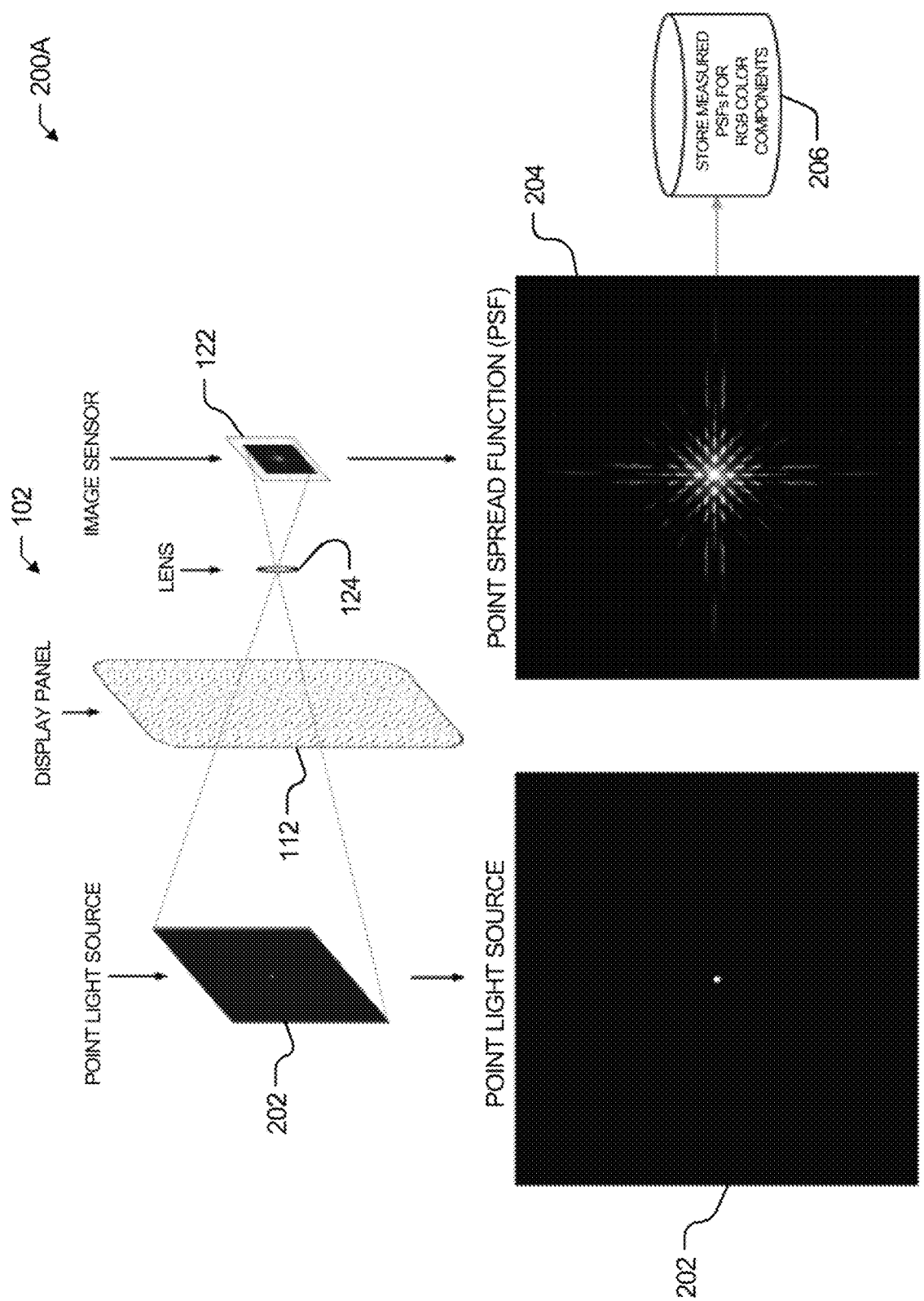
FIG. 2A illustrates an example system for measuring and determining one or more premeasured point spread functions (PSFs) of an electronic device.

FIG. 2A illustrates an example system 200A for measuring and determining one or more premeasured point spread functions (PSFs) (e.g., individually for each of the RGB color components and/or one or more particular monochromatic color components) of an electronic device, in accordance with the presently disclosed embodiments. For example, the example system 200A may be utilized for measuring and determining a number of PSFs. In particular embodiments, the electronic device 102 may premeasure (e.g., determine experimentally during a calibration process and/or manufacturing process of the electronic device 102) and store the PSFs of the electronic device 102. In particular embodiments, as depicted by FIG. 2A, a point light source 202 (e.g., a white LED or an array of white LEDs) may emit a light wave into the direction of the electronic device 102 through, for example, a pinhole or other imperceptibly small aperture. The point light source 202 (e.g., a white LED light) may be placed behind a pinhole (~100 μm in diameter) and at a certain imaging distance away from the UDC system (e.g., display+camera). In particular embodiments, the light wave from the point light source 202 may pass through, for example, the display panel 112 and the camera lens 124, and may be ultimately detected by the image sensor 122.

In particular embodiments, the electronic device 102 may measure the one or more PSFs 204 for each of the RGB color components and/or one or more particular monochromatic color components based on, for example, a sampling of a transfer function corresponding to an effect of the display panel 112 in response to the point light source 202. For example, in particular embodiments, the one or more PSFs 204 of the electronic device 102 may represent the intensity response of the point light source 202. Note that the surrounding environment has to be completely dark for the PSF measurement to take place. This may usually be achieved by using an optical chamber or covering the setup 200A with optically black cloth. In particular embodiments, the electronic device 102 may store the one or more measured PSFs 204 into, for example, in a database 206 to be later utilized during an image reconstruction process.

Figure 2B:
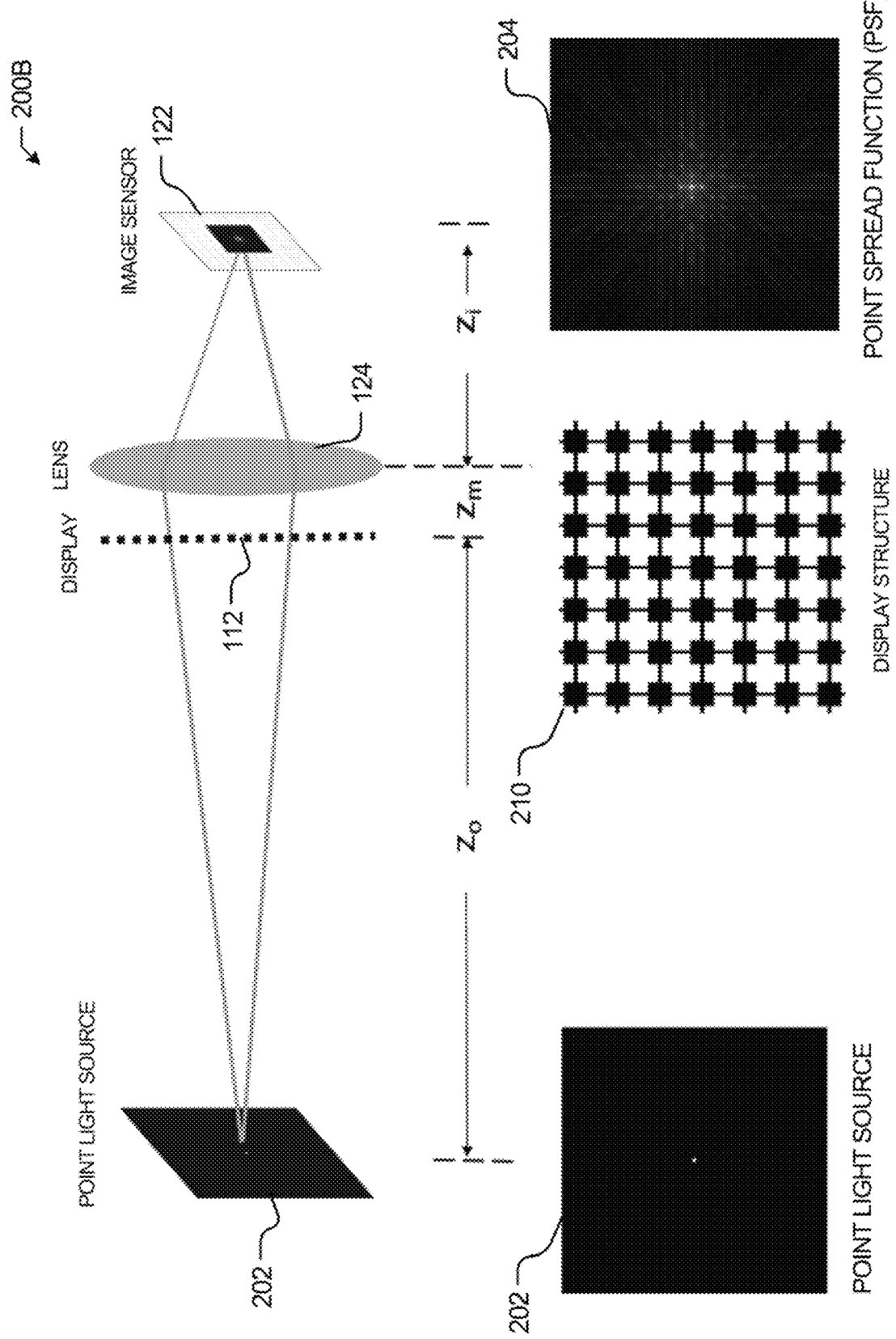
FIG. 2B illustrates another example system for PSF measurement through an example display structure.

FIG. 2B illustrates another example system 200B for PSF measurement through an example display structure 210. The example display structure 210 may be associated with the display panel 112. More specifically, the display structure 210 may have been used to manufacture the display panel 112 for use with the UDC system. As discussed elsewhere herein, the display structure 210 plays a dominant role in determination of the optical performance of the UDC system. For instance, the display structure 210 may have a direct impact on image quality that is achieved through the UDC system depicted in FIG. 2B. In particular embodiments, the optical performance of the UDC system or the image quality obtained through the UDC system may be determined through a PSF profile and corresponding modulation transfer function (MTF) profile, as shown and discussed in reference to FIGS. 3A-3B. The MTF profile may be obtained based on a Fourier transformation of the PSF.

Figure 3A:
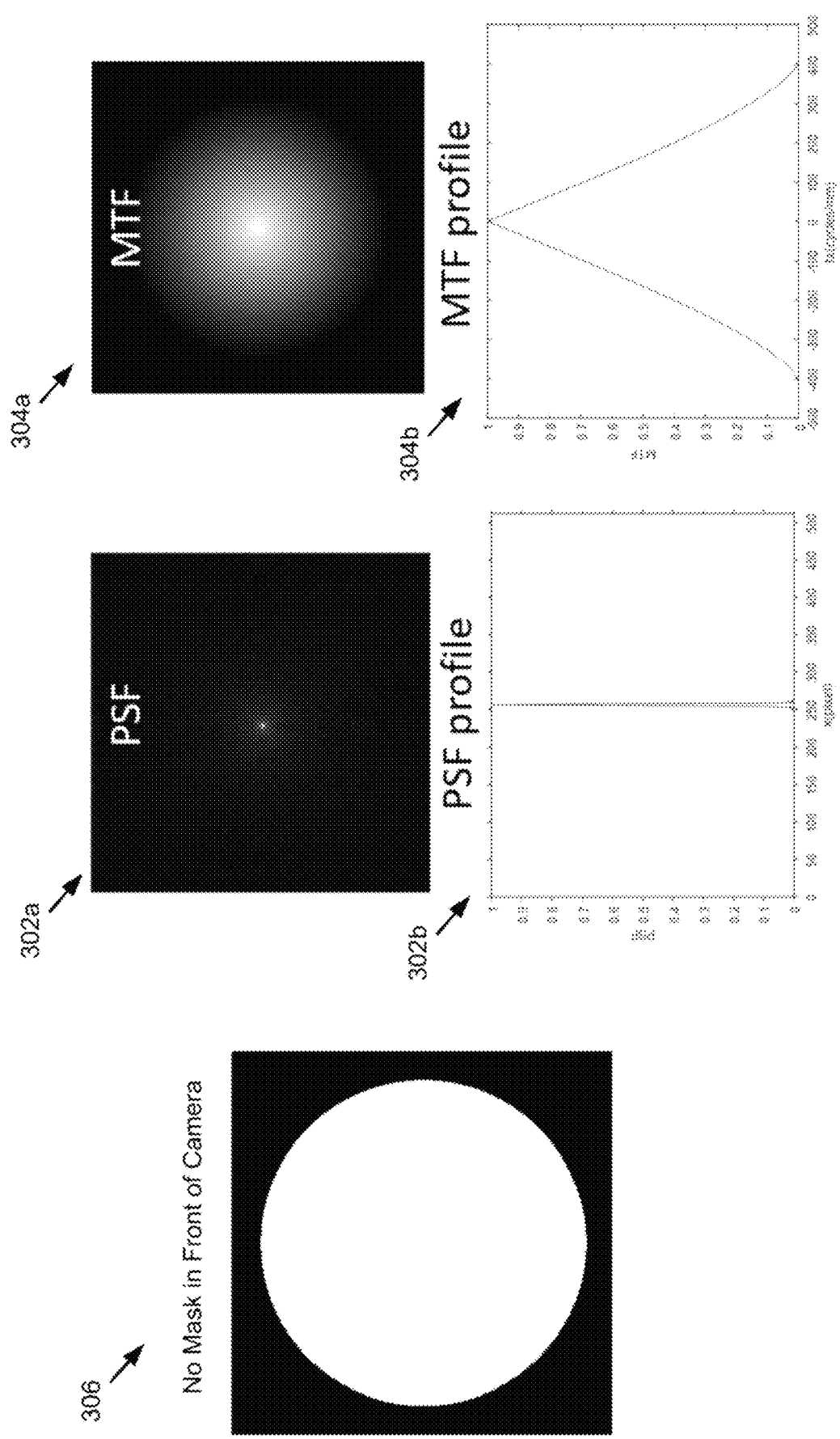
FIGS. 3A-3B illustrate example PSF and modulation transfer function (MTF) profiles in the absence and presence of a display structure, respectively.
Figure 3B:
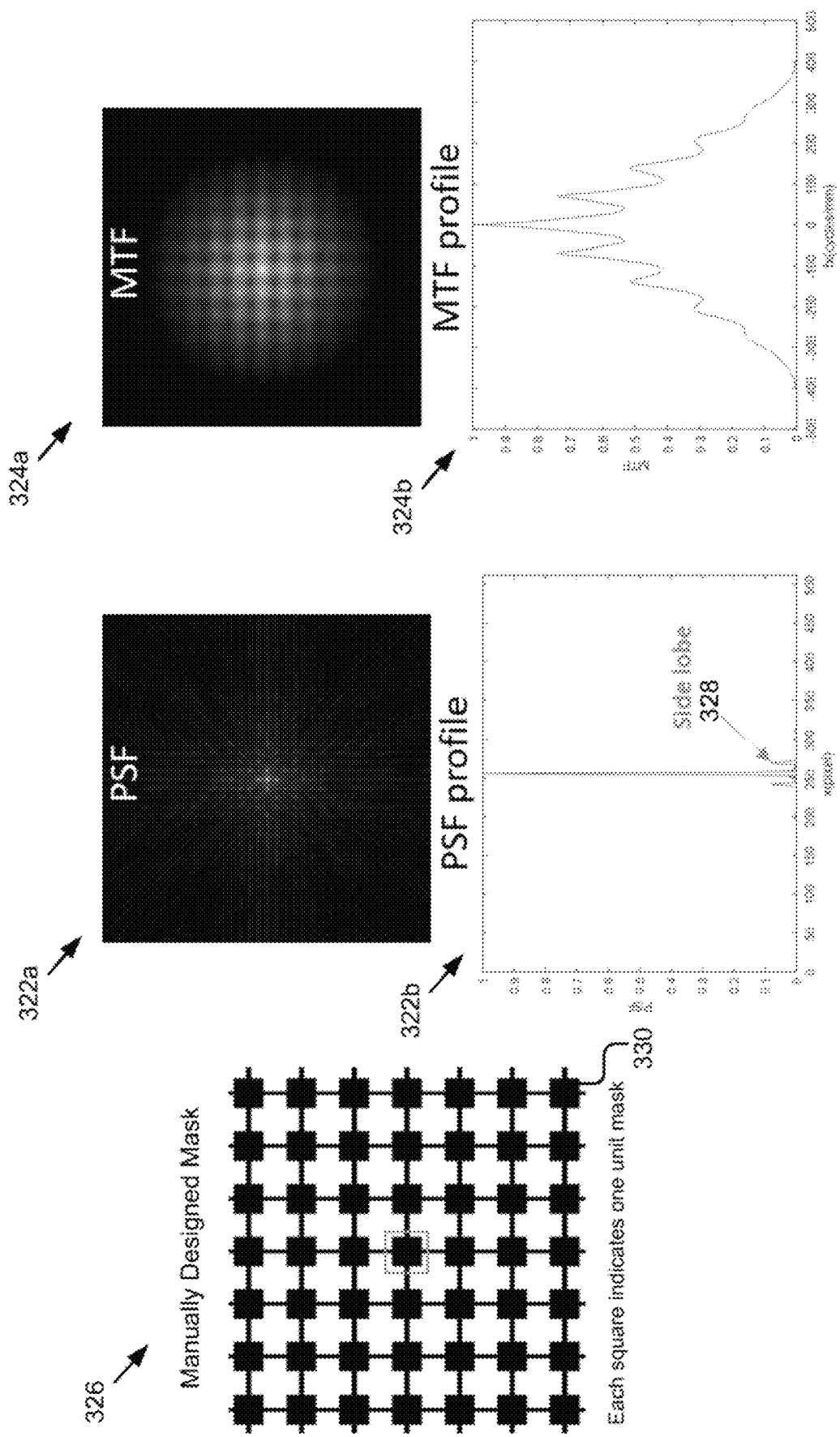

FIGS. 3A-3B illustrate example PSF and MTF profiles in the absence and presence of a display structure, respectively. In particular, FIG. 3A illustrates PSF 302a, corresponding PSF profile 302b, MTF 304a, and corresponding MTF profile 304b for a first case, where there is no display structure or mask in front of the camera, as indicated by reference numeral 306. FIG. 3B illustrates PSF 322a, corresponding PSF profile 322b, MTF 324a, and corresponding MTF profile 324b for a second case, where a manually designed display mask is present in front of the camera, as indicated by reference numeral 326. A display mask (e.g., mask 326) may be composed of a plurality of unit masks (e.g., as indicated by the square blocks 330). As discussed elsewhere herein, the mask is the bottom layer of the display (e.g., layer 424 of the OLED display as shown in FIG. 4) and is equivalent with the display structure in terms of effect on optical imaging. The specific issue related to a display structure or a mask is that the PSF profile 322b has significant side lobes (as indicated by reference numeral 328) as compared to the PSF profile 302b when no display mask is in place. Also, the MTF profile 324b has sharp peaks and troughs as compared to the MTF profile 304b, which is smooth when no display mask is present in front of the camera. These issues lead to significant decrease in image quality. Therefore, an automated search method is needed that can search for an optimized or improved display structure that can lower the PSF side lobes and/or smoothen the MTF distribution, and can give a similar performance as the case without a display structure.

FIG. 4 illustrates a front view 400 and section view 410 of a standard OLED display structure. The typical OLED display for consumer devices such as mobile phone is mostly opaque. Majority of photons from a world scene is blocked by the display structure. Therefore, image signal is not strong enough for image through it. As shown in the front view 400, each OLED pixel contains 4 subpixels (e.g., two green subpixels, one blue, and one red subpixel). For each subpixel, the driving TFT circuits is located next to it as indicated by cross hatched region. The black background layer is a reflection layer that reflect the OLED light back to enhance OLED brightness. The section view 410 shows a full stack of the display comprising a cover glass 412, a polarizer 414, a quarter wave plate 416, an encapsulation layer 418, OLED 420, TFT layer 422, and a back mask (or reflection) layer 424. The layers on top of OLED 420 i.e., layers 412-418 are mostly transparent. The TFT layer 422 and the reflection layer 424 are usually opaque for visible light. That is why OLED is not fit for imaging.

To take image through the OLED display, the display structure needs to be modified to enhance the transmittance. To minimize the effort of redesign of the display and maintain similar structure, some designing strategies may be adopted. FIGS. 5A-5B illustrate two example strategies for redesigning a display structure for a UDC system with a specified mask. Specifically, FIG. 5A illustrates a front view 500 of a redesigned display, a front view 510 of a back mask or reflection layer of the redesigned display, and a section view 520 of the redesigned display based on a first strategy. Similar to section view 410, the section view 520 also shows layers 522-534. Here, the first strategy is to reduce the pixel size, maintain pixel density, and design a back mask layer so that a larger spacing between the pixels may be transparent. For instance, as shown in the front view 500, the reflection layer 534 is not all black. Instead, only the region under pixel and TFT, as indicated by reference numeral 502, are opaque. This way, strong scattering from pixel structure and TFT may be avoided and may facilitate in image recovery.

FIG. 5B illustrates a front view 550 of a second redesigned display, a front view 560 of a back mask or reflection layer of the second redesigned display, and a section view 570 of the second redesigned display based on a second strategy. Similar to section views 410 or 520, the section view 570 also shows layers 572-584. Here, the second strategy for redesigning the display structure is that, for every four pixels, remove three pixels and only one pixel is kept. Other ways to reduce the pixel density may also be used, such as, for example, removing one pixel per two pixels. Also, the pixel may be enlarged to increase the brightness of each pixel.

It should be noted that the optimal pixel or display structure, as shown and discussed in FIGS. 5A and 5B, may be used for manufacturing of a display panel for a UDC system, display quality, and imaging quality. An automated method on how to optimize the display structure for imaging purposes is discussed in detail below in reference to at least FIGS. 6 and 11.

Figure 6:
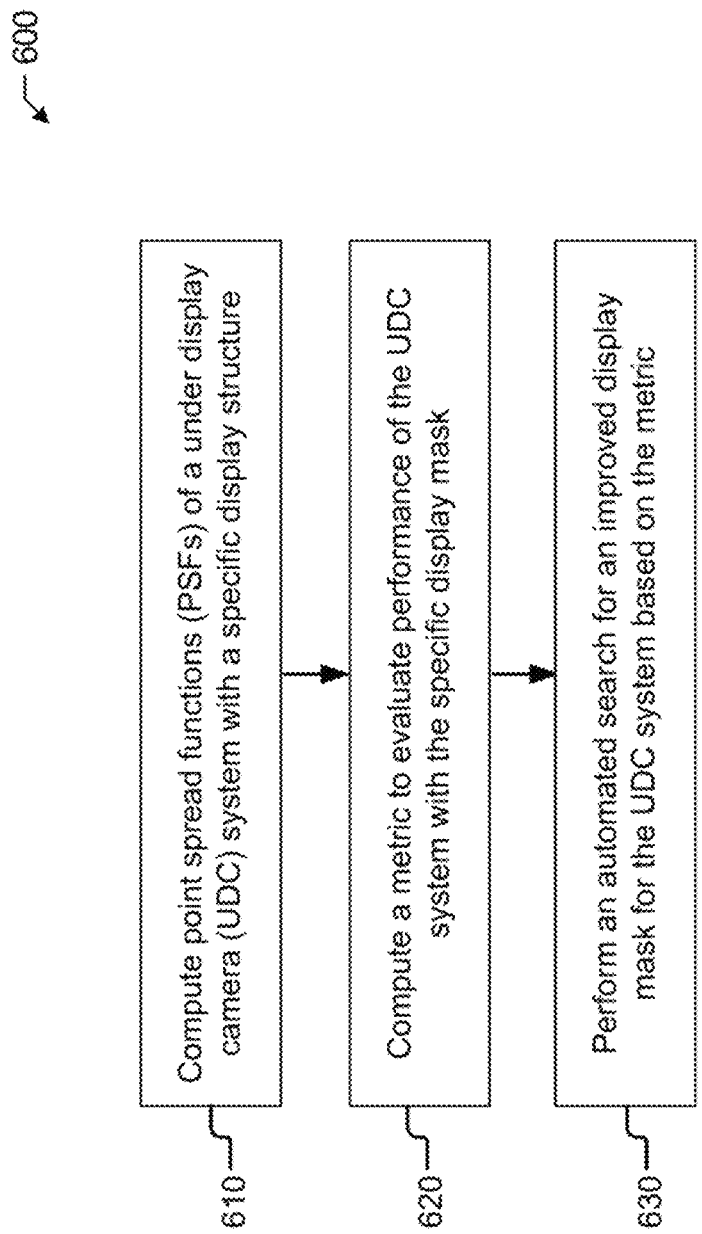
FIG. 6 is a block diagram illustrating high-level steps that may be performed to search for an improved display structure or optimize a display structure for use with a UDC system.

FIG. 6 is a block diagram 600 illustrating high-level steps that may be performed to search for an improved display structure or optimize a display structure for use with a UDC system (e.g., electronic device 102). At step 610, to automate searching for an improved mask or display structure, one or more processors of an electronic device (e.g., electronic device 102) may compute a point spread function (PSF) of a UDC system with a specific display structure or mask. In particular embodiments, the specific display structure may be initialized by choosing a shape (e.g., circle, square, etc.) of unit masks in the display structure, setting or configuring a list of parameters (e.g., center position, size, rotation angle) of each unit mask, and generating a set of points corresponding to the unit masks based on the configured list of parameters. In particular embodiments, the specific display structure may be initialized or generated based on steps 802-806 of the process 800 shown and discussed in reference to FIG. 8A. Once the specific display structure or mask is obtained, the PSF of the UDC system with that display structure may be computed using a numerical method, as shown and discussed below in reference to FIG. 7.

At step 620, the one or more processors of the electronic device (e.g., electronic device 102) may compute a metric that may be used to evaluate optical performance of the UDC system with a given back mask layer or specific display structure, as discussed above. The metric may be computed by comparing the PSF of the UDC system with the specific display structure to a reference PSF with no display mask or structure in place. Based on the comparison, it may be determined whether the PSF with the mask may achieve optical performance close to the case without the mask. For instance, the one or more processors of the electronic device may compute the metric to determine whether the difference between the PSF with the mask and the reference PSF without the mask satisfies selection criteria (e.g., difference less than a threshold value, difference is minimal, difference approaches zero, etc.). If the computed metric satisfies the selection criteria, then the specific display structure or mask may be deemed eligible for manufacturing a display panel of the UDC system. Otherwise, an automated search method may be performed to search for an optimal/improved display structure or optimize a display structure, as discussed below in step 630 or the automated search process or method shown in at least FIG. 8A.

Figure 8A:
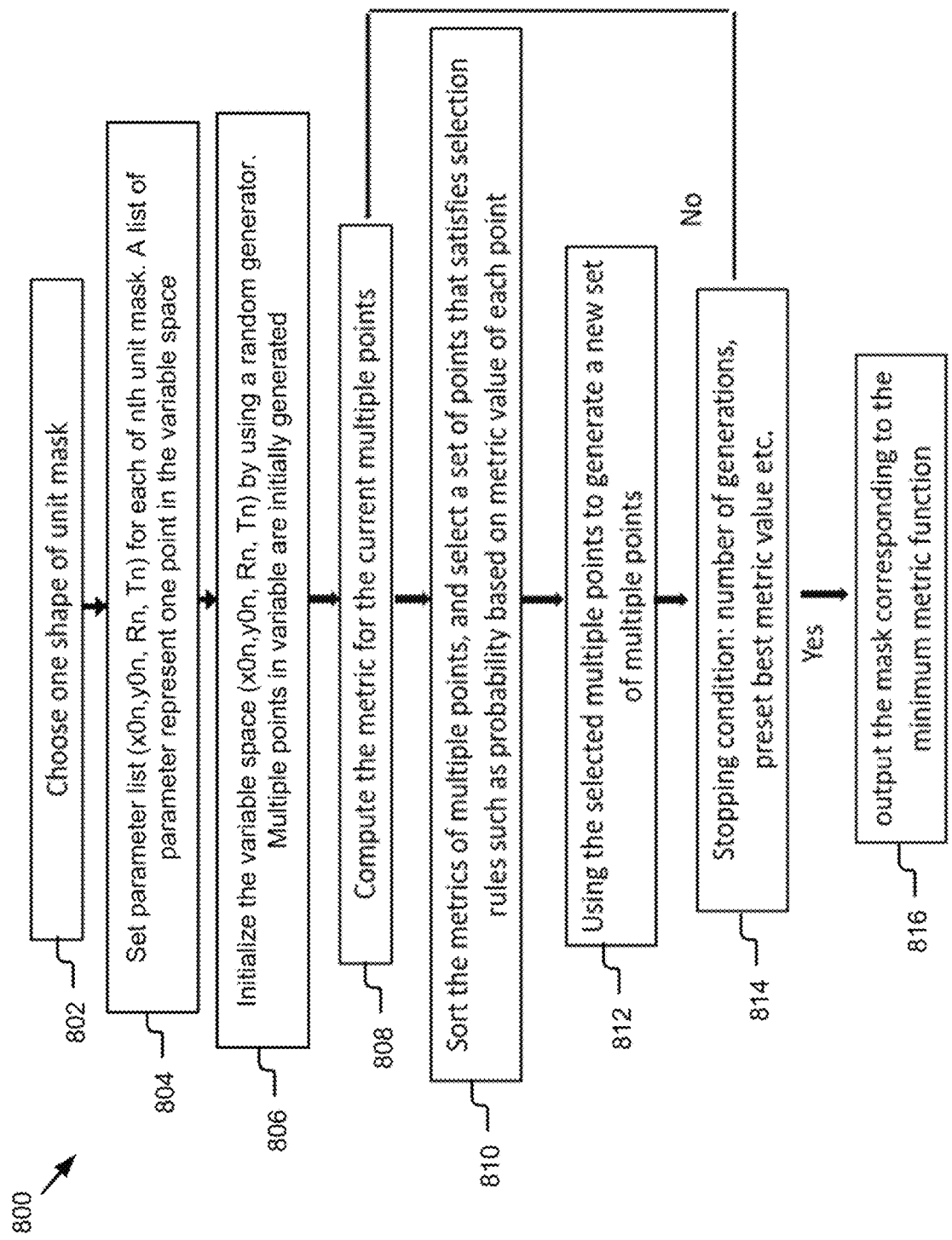
FIG. 8A illustrates an example method or process for searching for an improved display mask or structure by a computing device.
Figure 8B:
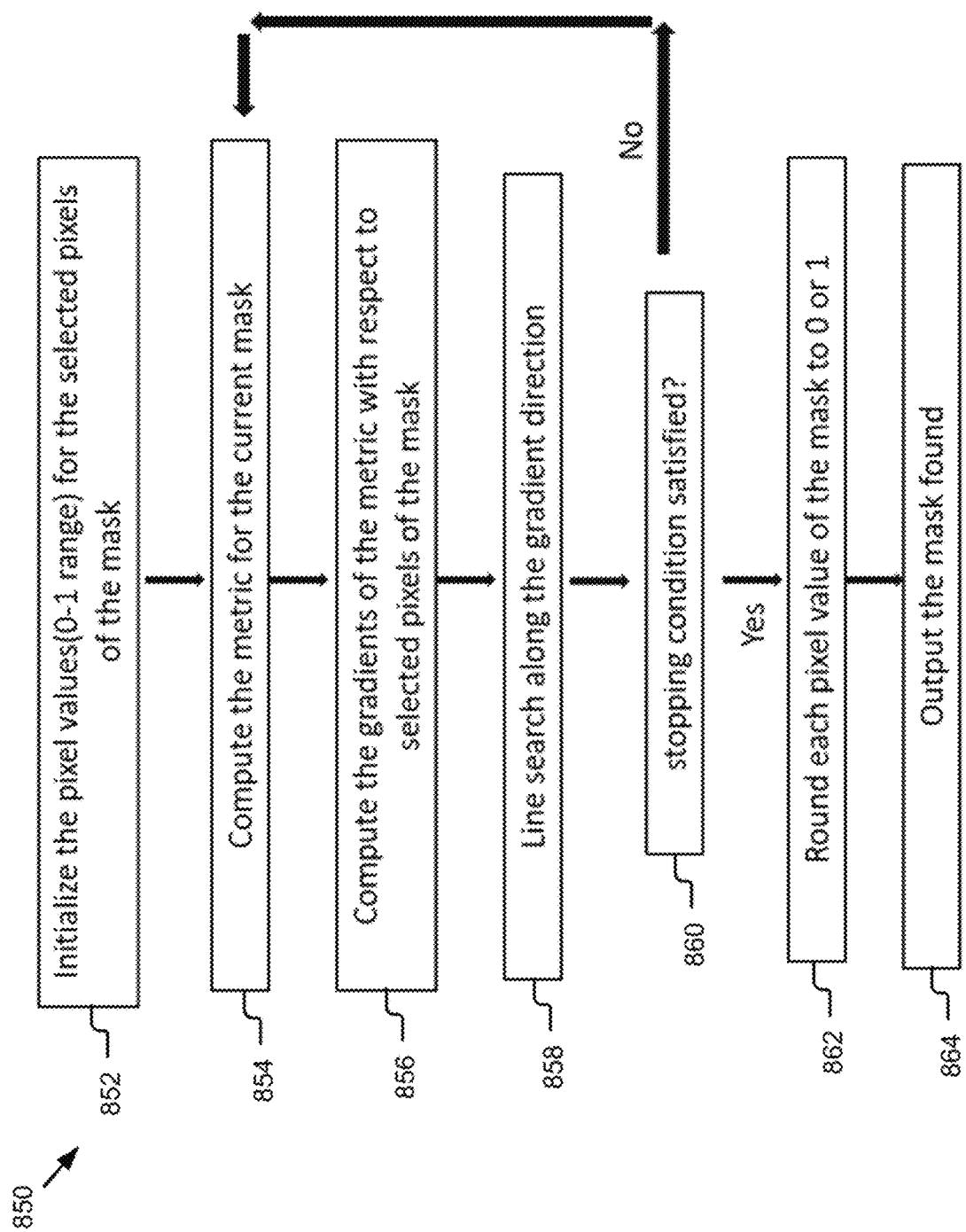
FIG. 8B illustrates another example method or process for searching for an improved display mask or structure by a computing device.

At step 630, in response to determining that the specific display structure is not adequate for manufacturing the display based on the metric (e.g., metric value does not satisfy selection criteria), the one or more processors of the electronic device (e.g., electronic device 102) may perform an automated search for an improved display structure or mask based on the process shown and discussed in reference to at least FIGS. 8A-8B. In particular embodiments, the automated search may include iteratively searching for or optimizing a display structure based on steps 808-814 of FIG. 8A until a stopping condition is reached (e.g., preset number of iterations have been performed, the metric satisfies selection criteria, minimum metric value has been achieved, etc.). Responsive to completion of the automated search process, the optimized display structure corresponding to minimum metric function may be output or generated and may be used for manufacturing the display panel for the UDC system.

Each of the steps 610, 620, and 630 is now discussed in detail below in their corresponding subsections.

PSF Measurement of UDC System with a Specified Display Structure

To automate searching for an improved mask, a PSF of the UDC system with a specified display structure or mask may be computed by a computing device, such as the electronic device 102. PSF may be simulated numerically given the design of the pixel display. Light propagation and diffraction are both physics-based processes that may be processed by a set of equations, as shown and discussed later below. If the structure of the display is known, how does a single point of light gets propagated and diffracted in the UDC system (e.g., UDC system 200B) may be modeled. This gives a simulated PSF that may be sufficient close to a measured PSF, as discussed in reference to FIG. 2A.

Figure 7:
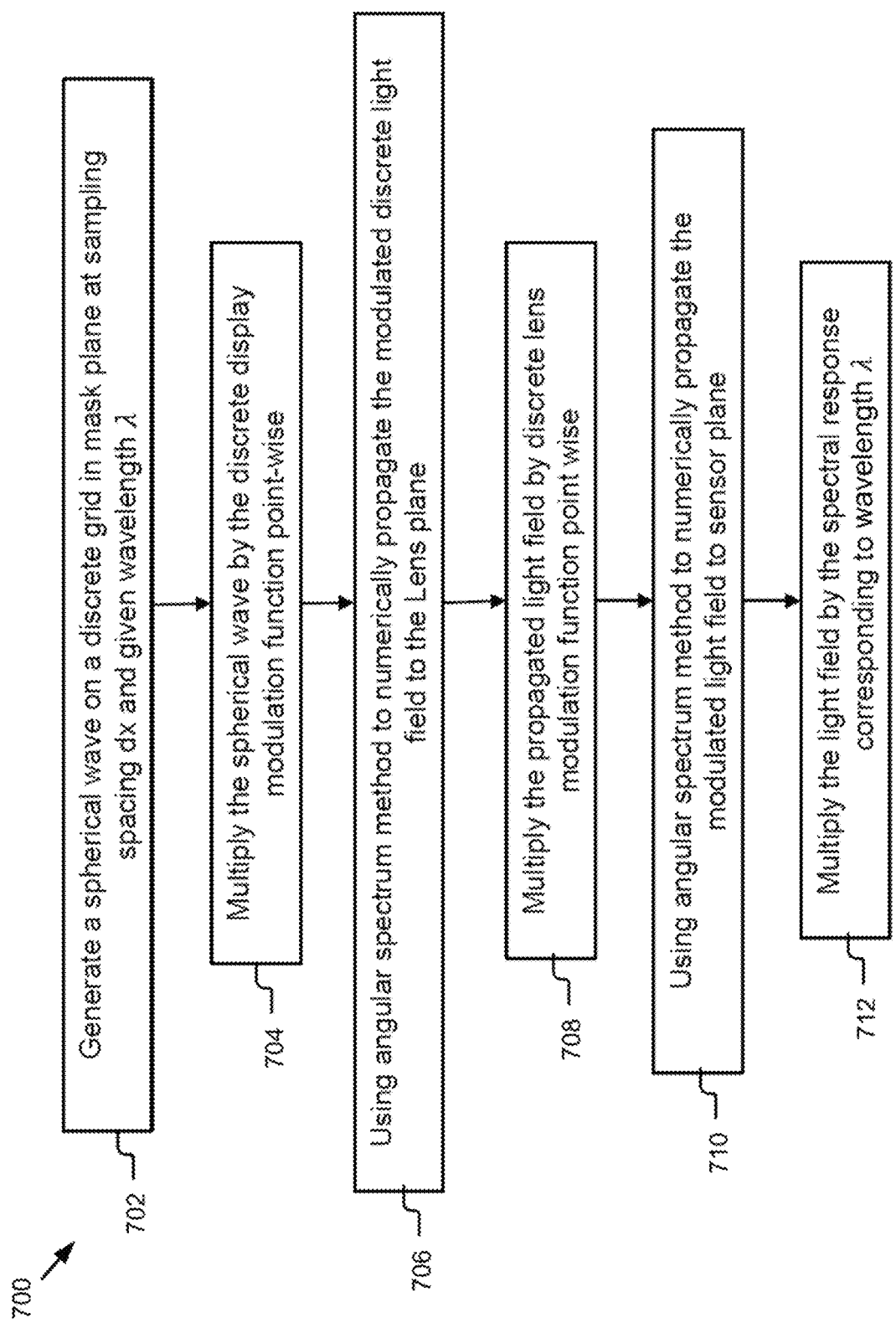
FIG. 7 illustrates an example method or process for numerically computing a PSF with wave propagation and wave modulation.

FIG. 7 illustrates an example method or process 700 for numerically computing a PSF with wave propagation and wave modulation. Specifically, the process 700 shows a specific procedure of numerically computing each R, G, B PSF of the camera behind display. The process 700 may begin with one or more processing devices (e.g., one or more processors 104 of the electronic device 102), at step 702, generating a spherical wave (also interchangeably referred to herein as a light field) on a discrete grid in a mask plane at sampling spacing dx and given wavelength k. The light field on the mask plane, generated from a point, may be given by the following equation:

$$O_{m0}(x_m, y_m, \lambda) = \frac{O(0, 0, \lambda)}{j\lambda z_o} \exp\left[\frac{j\pi}{\lambda z_o}(x_m^2 + y_m^2)\right]$$

At step 704, the one or more processing devices may multiply the spherical wave by the discrete display modulation function pointwise. For instance, the spherical wave may be modulated by the display mask. The light field or the spherical wave after being modulated by the mask may be given by the following equation:

$$O_m(x_m, y_m, \lambda) = \frac{M(x_m, y_m)O(0, 0, \lambda)}{j\lambda z_o} \exp\left[\frac{j\pi}{\lambda z_o}(x_m^2 + y_m^2)\right]$$

At step 706, the one or more processing devices may use an angular spectrum method to numerically propagate the modulated discrete light field to the lens plane. For instance, the modulated light field may propagate a distance of $z_m$ and pass through a lens (e.g., lens 124) at the lens plane. The light field after the lens of focal length f may be given by the following equation:

$$O_l(x_l, y_l, \lambda) =$$

$$\frac{P(x_l, y_l, \lambda)\exp\left[\frac{-j\pi}{\lambda}(x_l^2 + y_l^2)\right]}{j\lambda z_m} \int\int O_m(x_m, y_m, \lambda)$$

$$\exp\left\{\frac{j\pi}{\lambda z_m}[(x_l - x_m)^2 + (y_l - y_m)^2]\right\}dx_m dy_m$$

At step 708, the one or more processing devices may multiply the propagated light field by discrete lens modulation function pointwise. At step 710, the one or more processing devices may use an angular spectrum method to numerically propagate the modulated discrete light field (e.g., obtained after step 708) to the sensor plane. The resulting light field at the sensor plane (e.g., at image sensor 122) may be represented by the following equation:

$$O_l(x_l, y_l, \lambda) = \frac{1}{j\lambda z_{i,}} \int\int O_l(x_l, y_l, \lambda)\exp\left\{\frac{j\pi}{\lambda z_i}[(x_i - x_l)^2 + (y_i - y_l)^2]\right\}dx_l dy_l$$

The PSF at a given wavelength $\lambda$ may be computed by the following equation:

$$h(x_s, y_s, \lambda) = |O_s(x_s, y_s, \lambda)|^2$$

At step 712, to compute the PSF of each R, G, B channel, the one or more processing devices may multiply the resulting light field (e.g., obtained after step 710) by the spectral response corresponding to the given wavelength λ. The overall PSF of the imaging system (e.g., system 200B) may be obtained by incoherent superimposition of the product of PSF and corresponding spectral response F(λ) at each wavelength λ, as represented by the following equation:

$$h_k(x_s,y_s) = \Sigma[F_k(\lambda)h(x_s,y_s,\lambda)]d\lambda$$

In above equation, K means red (R), green (G), and blue (B) channel. F means spectral response. For one channel, PSF for different wavelengths may be incoherently added together to obtain the PSF for one channel, such as R. Same procedure (e.g., process 700) may be applied to compute PSFs of G and B channels.

Metric for Evaluating Performance of UDC System with a Specified Display Structure As discussed elsewhere herein, a metric may be used to evaluate optical performance with a given back mask layer or display structure. Assume at given wavelength λ, the PSF is given by:

$$h_k(x_s,y_s) = [F_k(\lambda)h(x_s,y_s,\lambda)]d\lambda \qquad (1)$$

For each R, G, B channel, the PSF is obtained by integrating the single wavelength PSF over the wavelength range with spectral response considered as shown in Eq. (1). In this equation:

$$h(x_s,y_s,\lambda) = |O_s(x_s,y_s,\lambda)|^2 \qquad (2)$$

$F_k(\lambda)$ is the spectral response function. dλ is the wavelength step. K represents color channel such as R, G, B. In particular embodiments, the metric may be expressed as following:

$$M = \alpha \sum_{K=R,G,B} |h_K(x_s, y_s) - h_{K,ref}(x_s, y_s)|^2 g(x_s, y_s) \qquad (3)$$

In Eq. (3), α is a global coefficient to regulate the metric, $h_{k,ref}$ is the PSF with no display structure/mask in place, and g serves as the pixel region selection function to regulate the pixels in the PSF that are used for computing M. In particular embodiments, if M approaches zero, that means the PSF with the display structure/mask may achieve optical performance close to the case without the mask.

In an alternative embodiment, instead of comparing the PSF with display mask to reference PSF without mask, their modulation transfer functions (MTFs) may instead be compared. As discussed elsewhere herein, the MTF may be obtained by taking a Fourier transform of the PSF. In this case, the metric may be computed as follows:

$$M = \alpha \sum_{K=R,G,B} |MTF_K(f_x, f_y) - MTF_{K,ref}(f_x, f_y)|^2 G(f_x, f_y) \qquad (4)$$

In Eq. (4), α is a global coefficient to regulate the metric, $MTF_k$ is the modulation transfer function of the camera behind display with the display structure/mask in place at K channel, which represents color channel such as R, G, or B. $MTF_{k,ref}$ corresponds to the modulation transfer function without the display structure/mask in place as the reference to compare. G is the pixel selection to regulate the pixels to be evaluated. $MTF_k$ is given by the normalized modulus of Fourier transformation of PSF of the system, expressed as:

$$MTF_K = \frac{|FT\{h_K\}|}{|FT\{h_K\}(0,0)|}$$

In another alternative embodiment, the metric may be computed based on the smoothness of the MTF profile without a comparison with the MTF of clear aperture. In this case, the metric may be computed as follows:

$$M = \alpha \sum_{K=R,G,B} \sum_{\theta} S\{MTF_K(r, \theta)\} \qquad (5)$$

In Eq. (5), α is a global coefficient to regulate the metric, $MTF_k$ is the modulation transfer function of the camera behind display with the display structure/mask in place at K channel, which represents color channel such as R, G, or B. Here a polar coordinate (r, θ) at ($f_x$, $f_y$) plane is used. r is the radial coordinate and θ is the angular coordinate and θ is the angular coordinate. S{ } operator means taking smoothness of the MTF profile at given θ. For example, if θ=0 radian, $MTF_K$(r, 0) represents profile along horizontal directions. S may be given by:

$$S\{MTF_K(r, \theta)\} = \sum \left| \frac{d(MTF_K(r, \theta) - c_1 r - c_0)}{dr} \right|$$

Where $c_1$ and $c_0$ are obtained by linear curve fitting the profile. The MTF profile is then subtracted by the fitted line. This way, the slope of the MTF profile will be removed. Derivatives of the slope-removed profile may then be taken and then an absolute value of the derivatives may be computed. The smoothness is finally computed by summing up the absolute values of the derivatives. In some embodiments, S may be given by:

$$S\{MTF_k(r,\theta)\} = std\{MTF_k(r,\theta) - c_1 r - c_0\}$$

Where $c_1$ and $c_0$ are obtained by linear curve fitting the profile. The MTF profile is then subtracted by the fitted line. Different from previous definition, this smoothness is given by the standard deviation of the slope-removed MTF profile.

In yet another alternative embodiment, the metric may also be based on the PSF due to display structure/mask without a need of comparison with the clear aperture. In this case, the metric may be computed as follows:

$$M = \alpha \sum_{K=R,G,B} \sum_{n=1,N} std\{h_K(x_s, y_s)g_n(x_s, y_s)\} \qquad (6)$$

In Eq. (6), α is a global coefficient to regulate the metric, $h_k$ is the PSF with the display structure or mask in place. $g_n$ serves as ring shape region selection function. The PSF distribution may be divided into multiple (N) ring-shape regions. A standard deviation of the PSF may be then be evaluated within each ring-shape region. The resulting standard deviations may be summed up over the N regions and three color channels (e.g., R, G, and B). This metric may be driving the mask to generate a PSF distribution that is close to a circularly symmetric distribution. Reshaping PSF from star-like distribution is to distribute the side lobe(s) in several locations to an angularly uniform distribution, thereby reducing the side lobe strength.

Automated Searching for an Improved Display Structure

FIG. 8A illustrates an example method or process 800 for searching for an improved display mask or structure by a computing device, such as an electronic device 102. Specifically, FIG. 8A shows a non-gradient based search method for finding an optimal display structure for manufacturing a display panel for a UDC system. As shown in FIG. 3B, an example display structure, such as the display structure 326, is composed of multiple unit masks 330 of a certain shape. The shape may be, for example and without limitation, a circle, a square, etc. The process 800 may begin with one or more processing devices (e.g., one or more processors 104 of the electronic device 102), at step 802, choosing a particular shape of a unit mask for initializing or generating an initial display structure. For example, the shape may be circle.

At step 804, the one or more processing devices may set or configure, for each unit mask, a list of parameters ($x_{0n}$, $y_{0n}$, $R_n$, $T_n$). Here ($x_{0n}$, $y_{0n}$) is the center position of the nth unit mask, $R_n$ is the size of the nth unit mask, and $T_n$ is the rotation angle of the nth unit mask. For boundaries, $R_n$ may be set to in the range of [160, 240] pixels as an example. Other parameters have to be within their respective boundaries. In particular embodiments, a list of these parameters or variables ($x_{0n}$, $y_{0n}$, $R_n$, $T_n$) represents one point in the parameter or variable space. One point may determine the mask. Different points may determine different masks.

At step 806, the one or more processing devices may generate a set of randomly chosen points corresponding to the set of unit masks within the preset boundaries of the parameters ($x_{0n}$, $y_{0n}$, $R_n$, $T_n$) configured in step 804. In particular embodiments, multiple points may be generated using a random generator.

At step 808, the one or more processing devices may compute the metrics of the multiple points using, for example, Eq. (3) (as shown above). At step 810, the one or more processing devices may use genetic algorithms as example method to sort the multiple points through their metric values and apply a selection rule to choose or select a subset of points. For instance, the PSF of a UDC system with the display structure comprising the set of points (generated in step 806) may be compared with a reference PSF with no display structure to compute a metric value for each point and determine metric values of which points satisfy selection criteria. The selection criteria may be that the difference between the PSF with display structure and reference PSF with no display structure should be minimal or close to zero, as discussed elsewhere herein. In some embodiments, the selection rule or criteria may be based on probability of the point. The probability of the point may be proportional to the metric value. With this selection rule, the one or more processing devices may choose a subset of points from the set of points generated in step 806.

At step 812, the one or more processing devices may use the selected subset of points to generate a new set of multiple points. For instance, the one or more processing devices may apply cross over and mutation mechanisms to generate next generation of multiple points. In some embodiments, an initial display structure that was initialized using steps 802-806 may be updated to include one or more of the subset of points (e.g., selected in step 810) or subsequent set of points (e.g., generated in step 812). The initial display structure may further be updated to remove the points that did not meet or satisfy the selection rule or criteria.

At step 814, the one or more processing devices may determine whether the stopping condition is reached. In some embodiments, the stopping condition may include a preset or predefined number of iterations/generations to be performed, metric values for the current set of points (e.g., last generated set of points and/or selected subset of points) to be satisfying selection rule or criteria (e.g., minimum metric value), preset best metric value has been achieved, preset of number of iteration that best metric does not change, etc. If the result of the determination in step 814 is negative, then steps 808-814 may be repeated until the stopping condition is reached.

At step 816, responsive to determining that the stopping condition is reached in step 814, the one or more processing devices may output an optimized display structure or mask corresponding to the minimum metric function. Using the process 800 of FIG. 8A, all the possible shapes (e.g., circle, square, etc.) may be tested and the shape with the minimum metric may be selected as the final optimized mask. One example optimized mask or structure that is generated using the process 800 is depicted by reference numeral 900 in FIG. 9A. The final optimized mask or structure may then be used to manufacture a display for use with a UDC system, as shown and discussed in reference to at least FIGS. 5A-5B.

FIG. 8B illustrates another example method or process 850 for searching for an improved display mask or structure by a computing device, such as the electronic device 102. Specifically, FIG. 8B shows a gradient based search method for finding an optimal display structure for manufacturing a display panel for a UDC system. In this method 850, the variable space may be values of each pixel of a preselected region in the mask. The process 850 may begin with one or more processing devices (e.g., one or more processors 104 of the electronic device 102), at step 852, initializing pixel values that ranges from 0 to 1 for selected pixels of a display structure or mask. The pixel values may be generated through a random generator.

At step 854, the one or more processing devices may compute the metric for the current display structure or mask. In particular embodiments, the metric may be computed using Eq. (3) as discussed above. At step 856, the one or more processing devices may compute, for each initial point, the gradient of the metric with respect to the selected pixels of the mask. At step 858, the one or more processing devices may compute a conjugate gradient direction and perform a line search along the gradient direction.

At step 860, the one or more processing devices may determine whether the stopping condition is satisfied, as discussed elsewhere herein. If not, then steps 854-860 may be repeated until the stopping condition is satisfied. At step 862, responsive to determining that the stopping condition is satisfied, the one or more processing devices may round off each pixel value of the mask to 0 or 1. At step 864, the one or more processing devices may output the resulting mask or display structure, which may be used to manufacture a display for use with a UDC system, as discussed elsewhere herein. It should be understood that FIG. 8B illustrates one example gradient-based method for searching for an optimal display mask and other gradient-based methods may be used for this procedure as well. This way, a set of optimized masks from each initial mask may be obtained. By comparing the metrics, the best mask among the set of optimized masks may be set or selected as the finalized mask for manufacturing a display panel for a UDC system.

Figure 9A:
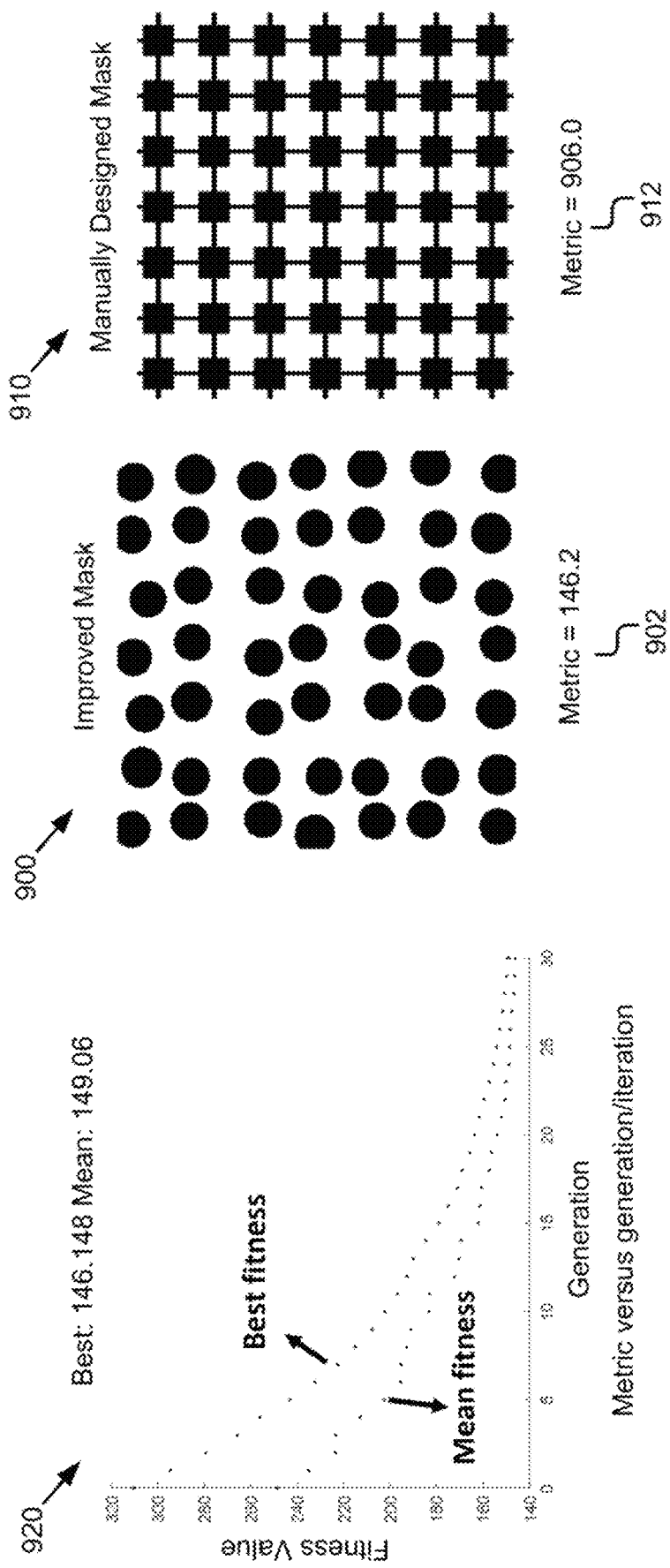
FIG. 9A illustrates an example comparison between an improved display mask generated using an automated searching process discussed herein and a manually designed mask based on a prior manual process.

FIG. 9A illustrates an example comparison between an improved display mask 900 generated using the automated searching process (e.g., process 800) discussed herein and a manually designed mask 910 based on a prior manual process. Specifically, FIG. 9A shows the comparison between the two masks 900 and 910 when metrics 902 and 912 for evaluation of these masks are computed according to the primary metric computation technique as shown and discussed in Eq. (3) above. As depicted, the metric 902 associated with the improved display mask 900 is significantly lower than the metric 912 associated with the manually designed mask 910. The lower value of the metric 902 indicates that the improved mask 900 is suitable to be used for manufacturing of a display panel for a UDC system. FIG. 9A also illustrates an example graph 920 showing an inverse relationship between metric values and number of iterations performed during the automated searching process (e.g., process 800). As can be observed from the graph 920, the metric values decrease with increasing number of iterations (i.e., steps 808-814). In other words, as the initial display structure or mask is iteratively optimized based on steps 808-814 of FIG. 8A, the metric value decreases and makes it closer to the stopping condition. The graph 920 illustrates both the best as well as mean metric values. For instance, the best metric value is 146.148 and the mean metric value is 149.06.

Figure 9B:
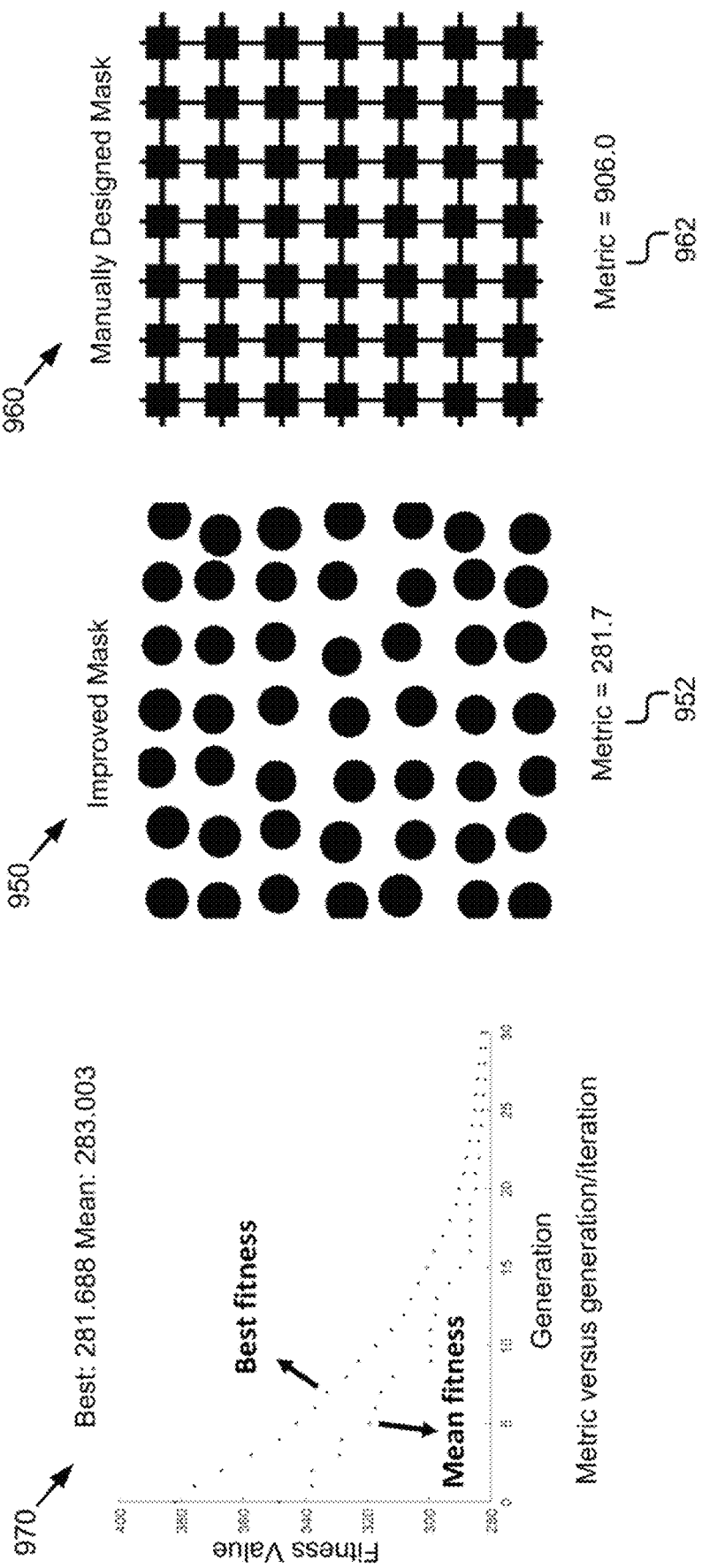
FIG. 9B illustrates another example comparison between an improved display mask generated using an automated searching process discussed herein and a manually designed mask based on a prior manual process.

FIG. 9B illustrates another example comparison between an improved display mask 950 generated using the automated searching process (e.g., process 800) discussed herein and a manually designed mask 960 based on a prior manual process. Specifically, FIG. 9B shows the comparison between the two masks 950 and 960 when metrics 952 and 962 for evaluation of these masks are computed according to one of the alternative metric computation techniques, such as Eq. (4), Eq. (5), or Eq. (6), as discussed above. As depicted, the metric 952 associated with the improved display mask 950 is still considerably lower than the metric 962 associated with the manually designed mask 960. Similar to FIG. 9A, FIG. 9B also illustrates an example graph 970 showing an inverse relationship between metric values and number of iterations performed during the automated searching process (e.g., process 800). As can be observed from the graph 970, the metric values decrease with increasing number of iterations (i.e., steps 808-814). Similar to graph 920, the graph 970 illustrates both the best as well as mean metric values. For instance, the best metric value in this case is 281.668 and the mean metric value is 283.003.

Figure 10A:
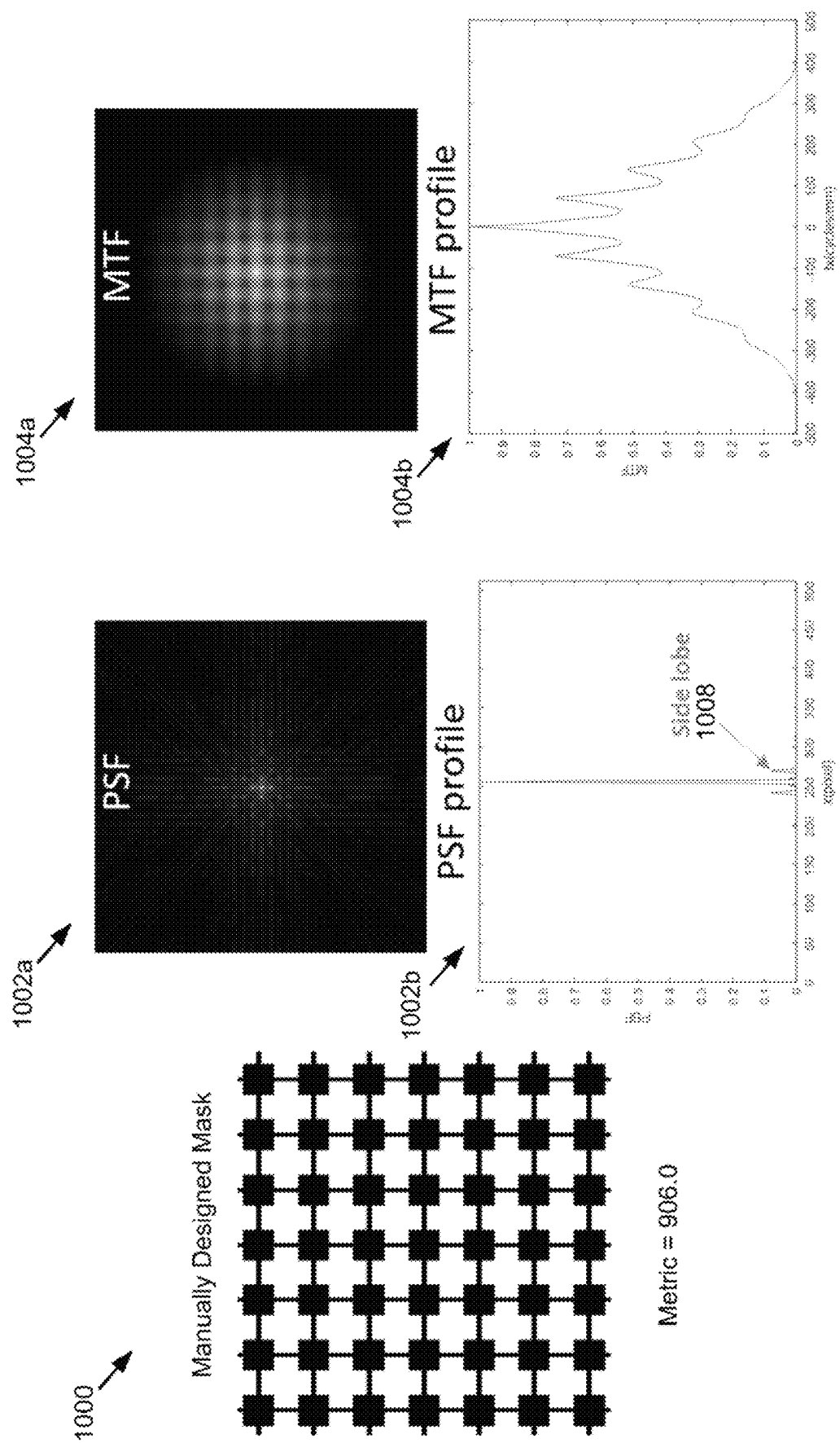
FIGS. 10A-10C illustrate example comparisons between PSF and MTF profiles associated with a prior manually designed mask, a first improved display mask based on using a first metric computation technique, and a second improved display mask based on using a second metric computation technique.
Figure 10B:
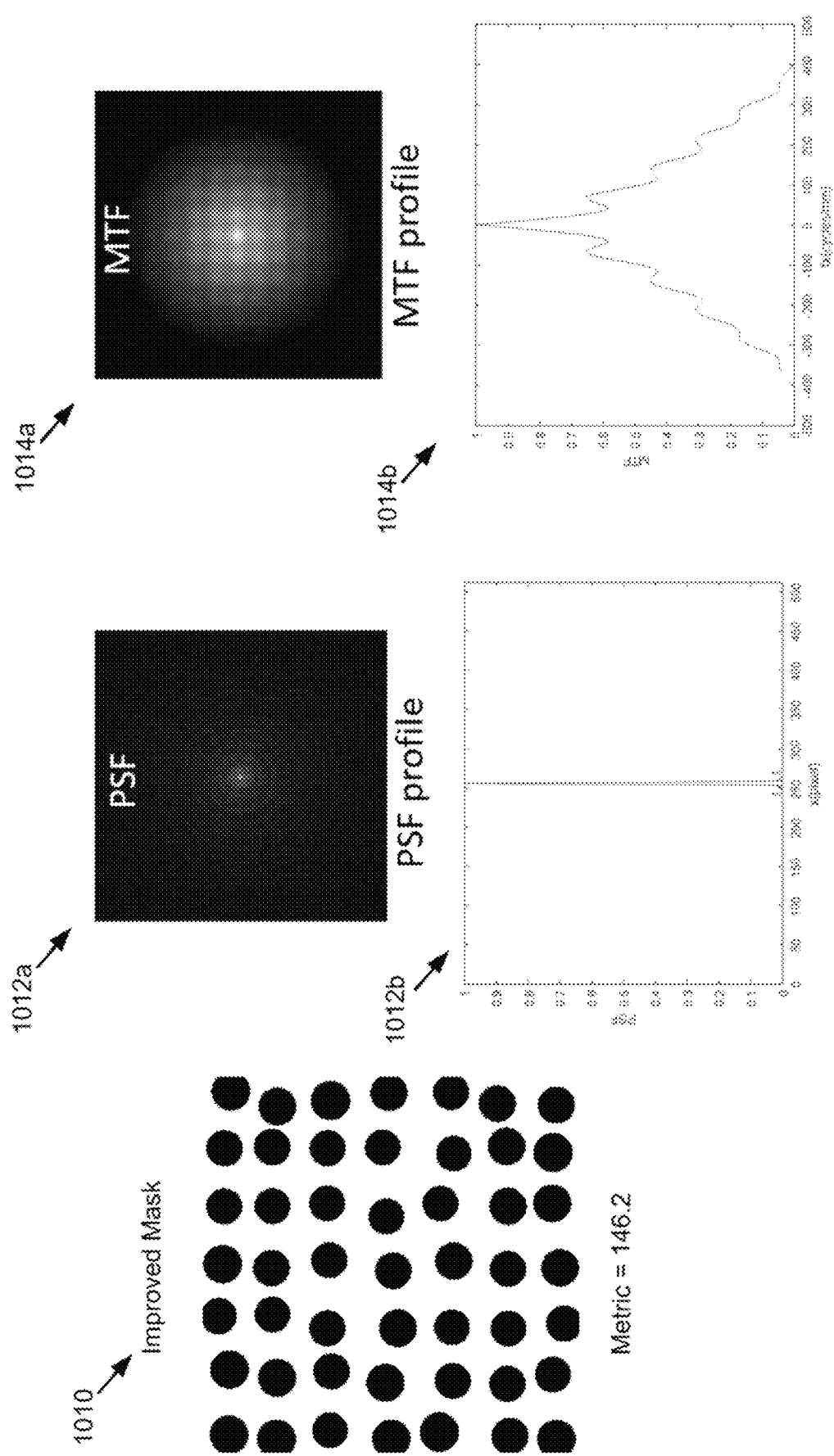
Figure 10C:
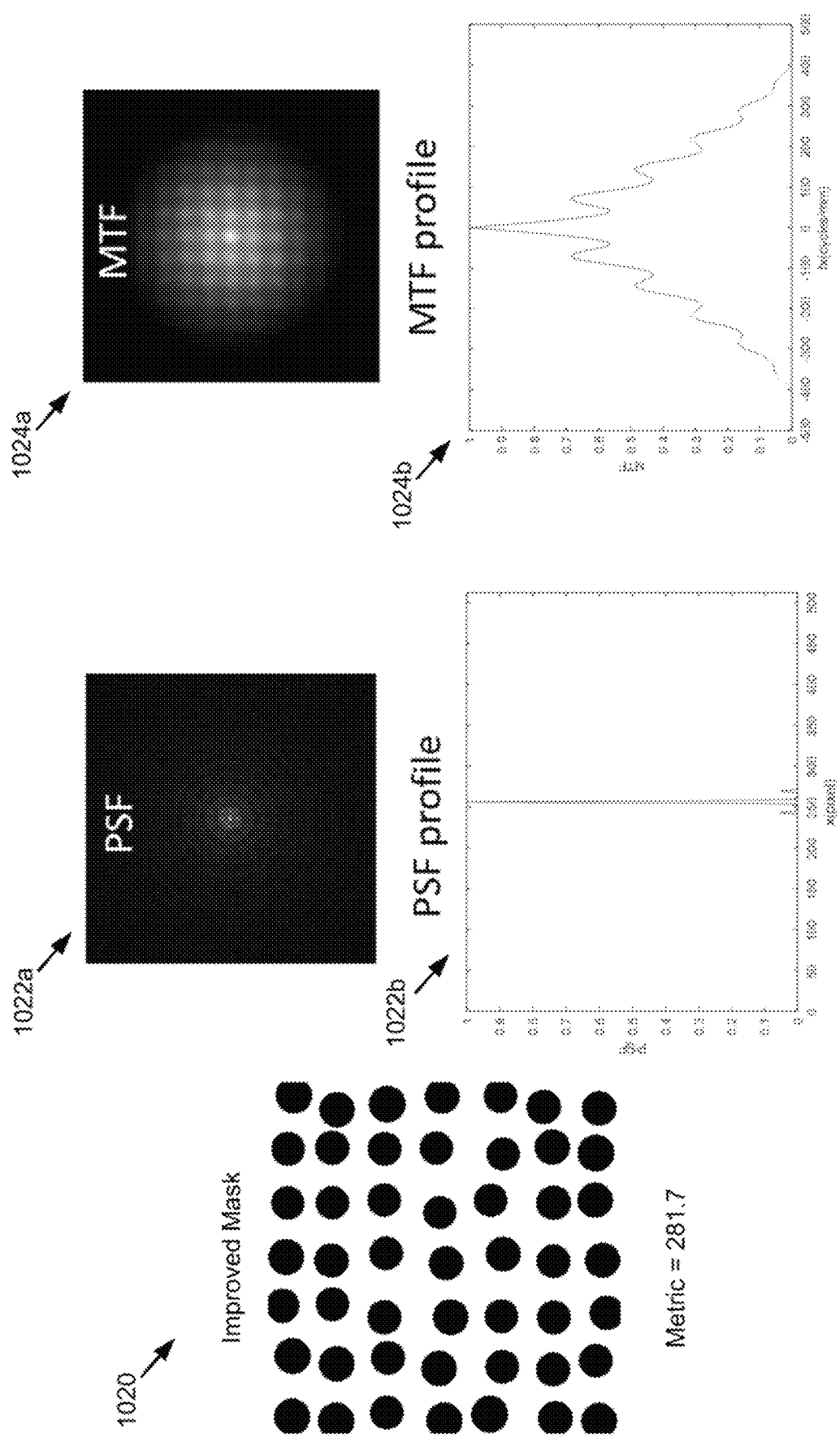

FIGS. 10A-10C illustrate example comparisons between PSF and MTF profiles associated with a prior manually designed mask 1000, a first improved display mask 1010 based on using a first metric computation technique, and a second improved display mask 1020 based on using a second metric computation technique. Specifically, FIG. 10A illustrates the prior manually designed mask 1000, PSF 1002a, corresponding PSF profile 1002b, MTF 1004a, and corresponding MTF profile 1004b. FIG. 10B illustrates the first improved display mask 1010, PSF 1012a, corresponding PSF profile 1012b, MTF 1014a, and corresponding MTF profile 1014b. Here, the first improved display mask 1010 may be obtained based on using the primary metric computation technique as shown and discussed in Eq. (3) above. FIG. 10C illustrates the second improved display mask 1020, PSF 1022a, corresponding PSF profile 1022b, MTF 1024a, and corresponding MTF profile 1024b. Here, the second improved display mask 1020 may be obtained based on using one of the alternative metric computation techniques, such as Eq. (4), Eq. (5), or Eq. (6), as discussed above.

As can be observed by comparing FIGS. 10A-10C, the PSF profiles 1012b or 1022b and the MTF profiles 1014b or 1024b of the improved masks 1010 or 1020 are relatively more refined and smoother than the PSF profile 1002b and the MTF profile 1004b of the prior manually designed mask 1000. For instance, the PSF profile 1002b of the prior manually designed mask 1000 has significant side lobes (as indicated by reference numeral 1008) as compared to the PSF profiles 1012b or 1022b of the improved masks 1010 or 1020. Also, the MTF profile 1004b of the prior manually designed mask 1000 has sharp peak and trough as compared to the MTF profiles 1014b or 1024b of the improved masks 1010 or 1020.

Systems and Methods

Figure 11:
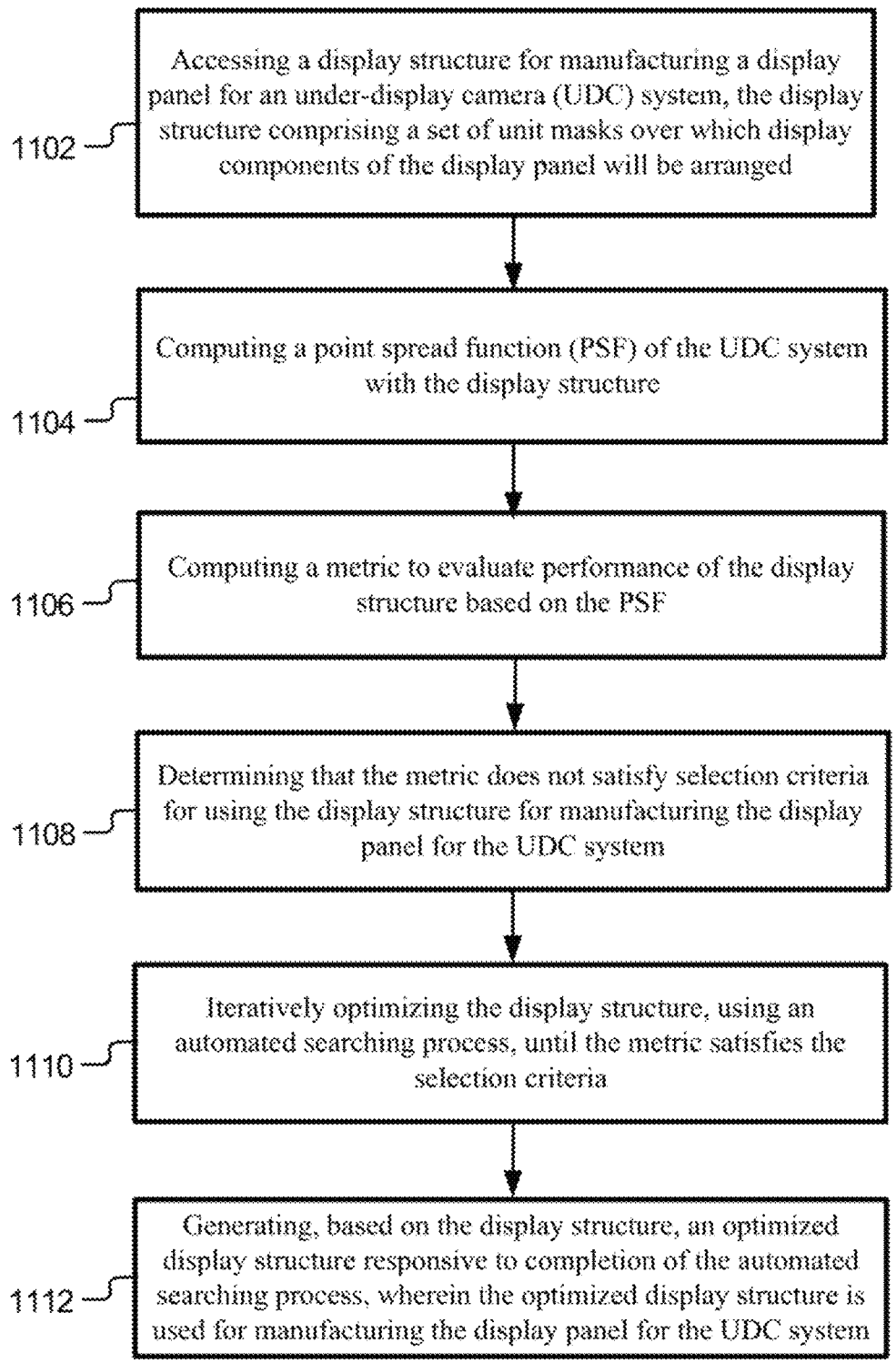
FIG. 11 illustrates a flow diagram of an example method for generating an optimized display structure or mask for manufacturing a display panel for a UDC system.

FIG. 11 illustrates a flow diagram of an example method 1100 for generating an optimized display structure or mask for manufacturing a display panel for a UDC system, in accordance with the presently disclosed embodiments. The method 1100 may be performed utilizing one or more processing devices (e.g., the one or more processors 104 of the electronic device 102) that may include hardware (e.g., a general purpose processor, a graphic processing unit (GPU), an application-specific integrated circuit (ASIC), a system-on-chip (SoC), a microcontroller, a field-programmable gate array (FPGA), a central processing unit (CPU), an application processor (AP), a visual processing unit (VPU), a neural processing unit (NPU), a neural decision processor (NDP), or any other processing device(s) that may be suitable for processing image data), software (e.g., instructions running/executing on one or more processors), firmware (e.g., microcode), or some combination thereof.

The method 1100 may begin at block 1102 with one or more processing devices (e.g., one or more processors 104 of the electronic device 102) accessing a display structure (e.g., an initial display structure) for manufacturing a display panel for an under-display camera (UDC) system. In particular embodiments, accessing the display structure may include performing steps 802-806 of FIG. 8A. The display structure may include a set of unit masks over which display components (e.g., LEDs, pixels) of the display panel will be arranged, as shown for example by reference numeral 510 in FIG. 5A or by reference numeral 560 in FIG. 5B. The method 1100 may then continue at block 1104 with the one or more processing devices (e.g., one or more processors 104 of the electronic device 102) computing a point spread function (PSF) of the UDC system with the display structure. In particular embodiments, the PSF may be computed using the process 700 illustrated in FIG. 7.

The method 1100 may continue at block 1106 with the one or more processing devices (e.g., one or more processors 104 of the electronic device 102) computing a metric to evaluate performance of the display structure based on the PSF. In particular embodiments, the metric may be computed according to Eq. (3), as discussed above. In alternative embodiments, the metric may also be computed according to one of the Eq. (4), Eq. (5), or Eq. (6), as discussed above. The method 1100 may then continue at block 1108 with the one or more processing devices (e.g., one or more processors 104 of the electronic device 102) determining that the metric does not satisfy selection criteria for using the display structure for manufacturing the display panel for the UDC system.

In response to determining that the metric does not satisfy the selection criteria, the method 1100 may continue at block 1110 with the one or more processing devices (e.g., one or more processors 104 of the electronic device 102) iteratively optimizing the display structure, using an automated searching process, until the metric satisfies the selection criteria. In particular embodiments, iteratively optimizing the display structure may include iteratively performing steps 808-814 of FIG. 8A. During each iteration 808-814, the display structure may be updated to filter out the points that did not meet/satisfy the selection rule or criteria and include the selected subset of points (e.g., as discussed in step 810 of FIG. 8A) and/or the new set of multiple points generated using the selected subset of points (e.g., as discussed in step 812 of FIG. 8A). The method 1100 may then conclude at block 1112 with the one or more processing devices (e.g., one or more processors 104 of the electronic device 102) generating, based on the display structure, an optimized display structure responsive to completion of the automated searching process. In particular embodiments, generating the optimized display structure may include performing step 816 of FIG. 8A. The optimized display structure may be used for manufacturing the display panel for the UDC system.

Figure 12:
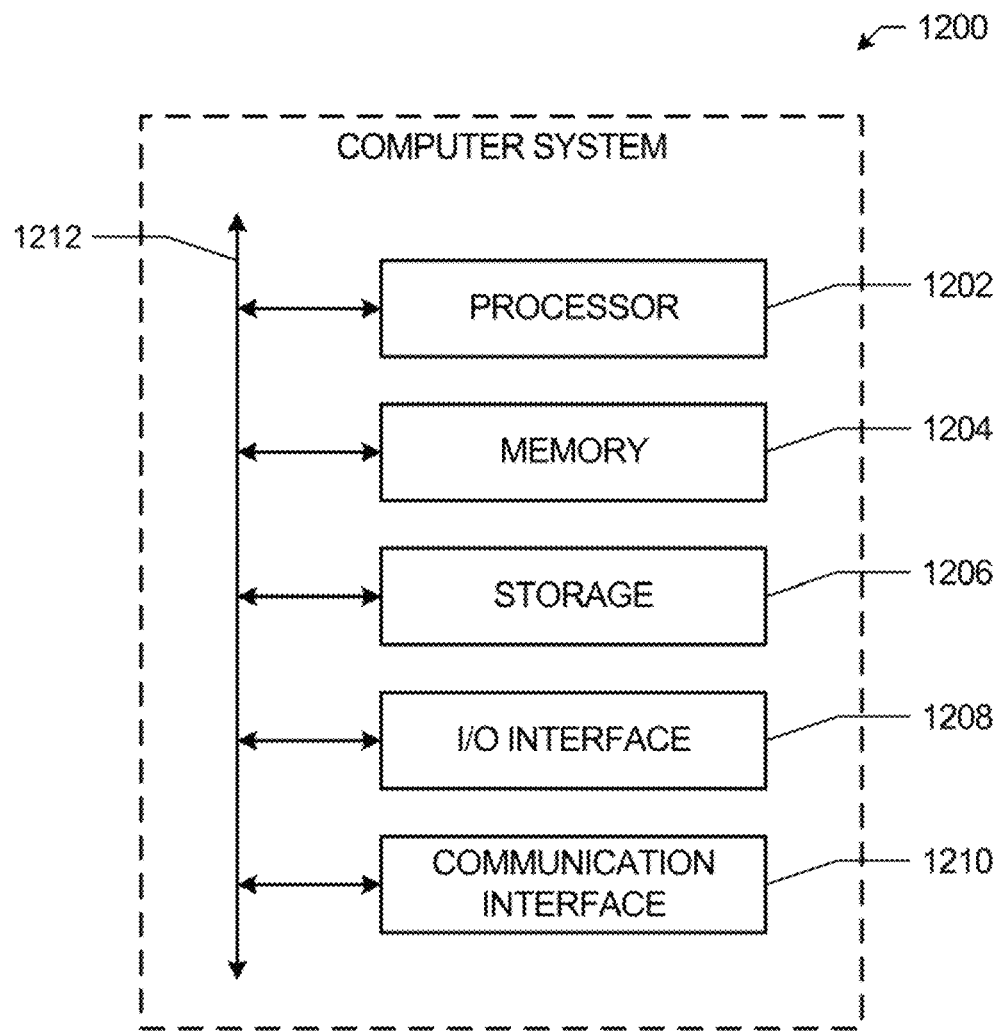
FIG. 12 illustrates an example computer system.

FIG. 12 illustrates an example computer system 1200 that may be utilized for generating an optimized or improved display structure, in accordance with the presently disclosed embodiments. In particular embodiments, one or more computer systems 1200 perform one or more steps of one or more methods or processes described or illustrated herein. In particular embodiments, one or more computer systems 1200 provide functionality described or illustrated herein. In particular embodiments, software running on one or more computer systems 1200 performs one or more steps of one or more methods or processes described or illustrated herein or provides functionality described or illustrated herein. Particular embodiments include one or more portions of one or more computer systems 1200. Herein, reference to a computer system may encompass a computing device, and vice versa, where appropriate. Moreover, reference to a computer system may encompass one or more computer systems, where appropriate.

This disclosure contemplates any suitable number of computer systems 1200. This disclosure contemplates computer system 1200 taking any suitable physical form. As example and not by way of limitation, computer system 1200 may be an embedded computer system, a system-on-chip (SOC), a single-board computer system (SBC) (e.g., a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1200 may include one or more computer systems 1200; be unitary or distributed; span multiple locations; span multiple machines; span multiple data centers; or reside in a cloud, which may include one or more cloud components in one or more networks.

Where appropriate, one or more computer systems 1200 may perform without substantial spatial or temporal limitation one or more steps of one or more methods or processes described or illustrated herein. As an example, and not by way of limitation, one or more computer systems 1200 may perform in real time or in batch mode one or more steps of one or more methods or processes described or illustrated herein. One or more computer systems 1200 may perform at different times or at different locations one or more steps of one or more methods or processes described or illustrated herein, where appropriate.

In particular embodiments, computer system 1200 includes a processor 1202, memory 1204, storage 1206, an input/output (I/O) interface 1206, a communication interface 1210, and a bus 1212. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1202 includes hardware for executing instructions, such as those making up a computer program. As an example, and not by way of limitation, to execute instructions, processor 1202 may retrieve (or fetch) the instructions from an internal register, an internal cache, memory 1204, or storage 1206; decode and execute them; and then write one or more results to an internal register, an internal cache, memory 1204, or storage 1206. In particular embodiments, processor 1202 may include one or more internal caches for data, instructions, or addresses. This disclosure contemplates processor 1202 including any suitable number of any suitable internal caches, where appropriate. As an example, and not by way of limitation, processor 1202 may include one or more instruction caches, one or more data caches, and one or more translation lookaside buffers (TLBs). Instructions in the instruction caches may be copies of instructions in memory 1204 or storage 1206, and the instruction caches may speed up retrieval of those instructions by processor 1202. Data in the data caches may be copies of data in memory 1204 or storage 1206 for instructions executing at processor 1202 to operate on; the results of previous instructions executed at processor 1202 for access by subsequent instructions executing at processor 1202 or for writing to memory 1204 or storage 1206; or other suitable data. The data caches may speed up read or write operations by processor 1202. The TLBs may speed up virtual-address translation for processor 1202. In particular embodiments, processor 1202 may include one or more internal registers for data, instructions, or addresses. This disclosure contemplates processor 1202 including any suitable number of any suitable internal registers, where appropriate. Where appropriate, processor 1202 may include one or more arithmetic logic units (ALUs); be a multi-core processor; or include one or more processors 1202. Although this disclosure describes and illustrates a particular processor, this disclosure contemplates any suitable processor.

In particular embodiments, memory 1204 includes main memory for storing instructions for processor 1202 to execute or data for processor 1202 to operate on. As an example, and not by way of limitation, computer system 1200 may load instructions from storage 1206 or another source (such as, for example, another computer system 1200) to memory 1204. Processor 1202 may then load the instructions from memory 1204 to an internal register or internal cache. To execute the instructions, processor 1202 may retrieve the instructions from the internal register or internal cache and decode them. During or after execution of the instructions, processor 1202 may write one or more results (which may be intermediate or final results) to the internal register or internal cache. Processor 1202 may then write one or more of those results to memory 1204. In particular embodiments, processor 1202 executes only instructions in one or more internal registers or internal caches or in memory 1204 (as opposed to storage 1206 or elsewhere) and operates only on data in one or more internal registers or internal caches or in memory 1204 (as opposed to storage 1206 or elsewhere).

One or more memory buses (which may each include an address bus and a data bus) may couple processor 1202 to memory 1204. Bus 1212 may include one or more memory buses, as described below. In particular embodiments, one or more memory management units (MMUs) reside between processor 1202 and memory 1204 and facilitate accesses to memory 1204 requested by processor 1202. In particular embodiments, memory 1204 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1204 may include one or more memories 1204, where appropriate. Although this disclosure describes and illustrates particular memory, this disclosure contemplates any suitable memory.

In particular embodiments, storage 1206 includes mass storage for data or instructions. As an example, and not by way of limitation, storage 1206 may include a hard disk drive (HDD), a floppy disk drive, flash memory, an optical disc, a magneto-optical disc, magnetic tape, or a Universal Serial Bus (USB) drive or a combination of two or more of these. Storage 1206 may include removable or non-removable (or fixed) media, where appropriate. Storage 1206 may be internal or external to computer system 1200, where appropriate. In particular embodiments, storage 1206 is non-volatile, solid-state memory. In particular embodiments, storage 1206 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1206 taking any suitable physical form. Storage 1206 may include one or more storage control units facilitating communication between processor 1202 and storage 1206, where appropriate. Where appropriate, storage 1206 may include one or more storages 1206. Although this disclosure describes and illustrates particular storage, this disclosure contemplates any suitable storage.

In particular embodiments, I/O interface 1206 includes hardware, software, or both, providing one or more interfaces for communication between computer system 1200 and one or more I/O devices. Computer system 1200 may include one or more of these I/O devices, where appropriate. One or more of these I/O devices may enable communication between a person and computer system 1200. As an example, and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1206 for them. Where appropriate, I/O interface 1206 may include one or more device or software drivers enabling processor 1202 to drive one or more of these I/O devices. I/O interface 1206 may include one or more I/O interfaces 1206, where appropriate. Although this disclosure describes and illustrates a particular I/O interface, this disclosure contemplates any suitable I/O interface.

In particular embodiments, communication interface 1210 includes hardware, software, or both providing one or more interfaces for communication (such as, for example, packet-based communication) between computer system 1200 and one or more other computer systems 1200 or one or more networks. As an example, and not by way of limitation, communication interface 1210 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1210 for it.

As an example, and not by way of limitation, computer system 1200 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1200 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1200 may include any suitable communication interface 1210 for any of these networks, where appropriate. Communication interface 1210 may include one or more communication interfaces 1210, where appropriate. Although this disclosure describes and illustrates a particular communication interface, this disclosure contemplates any suitable communication interface.

In particular embodiments, bus 1212 includes hardware, software, or both coupling components of computer system 1200 to each other. As an example, and not by way of limitation, bus 1212 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1212 may include one or more buses 1212, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Miscellaneous

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Herein, "automatically" and its derivatives means "without human intervention," unless expressly indicated otherwise or indicated otherwise by context.

The embodiments disclosed herein are only examples, and the scope of this disclosure is not limited to them. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising, by an electronic device:
   accessing a display structure for manufacturing a display panel for an under-display camera (UDC) system, the display structure comprising a set of unit masks over which display components of the display panel will be arranged;
   computing a point spread function (PSF) of the UDC system with the display structure;
   computing a metric to evaluate performance of the display structure based on the PSF;
   determining that the metric does not satisfy selection criteria for using the display structure for manufacturing the display panel for the UDC system;
   in response to the determination, iteratively optimizing the display structure, using an automated searching process, until the metric satisfies the selection criteria; and
   generating, based on the display structure, an optimized display structure responsive to completion of the automated searching process, wherein the optimized display structure is used for manufacturing the display panel for the UDC system.

2. The method of claim 1, wherein accessing the display structure comprises:
   choosing a particular shape for the set of unit masks of the display structure;
   configuring, for each unit mask of the set of unit masks, a set of parameters, wherein the set of parameters for the respective unit mask represents a point in a variable space; and
   generating a set of points corresponding to the set of unit masks of the display structure based on the set of parameters configured for the set of unit masks.

3. The method of claim 2, wherein the set of parameters associated with the respective unit mask comprises a position, a size, and a rotation angle of the respective unit mask.

4. The method of claim 2, wherein iteratively optimizing the display structure, using the automated searching process, comprises:
   (1) computing the metric for a current set of points in the display structure;
   (2) selecting a subset of the current set of points from the display structure based on the selection criteria;
   (3) generating a subsequent set of points using the selected subset of points;
   (4) updating the display structure based on one or more of the selected subset of points or the subsequent set of points; and
   (5) repeating steps (1)-(4) until a stopping condition is reached;
   wherein the optimized display structure is generated responsive to the stopping condition being reached.

5. The method of claim 1, wherein computing the metric comprises:
   accessing a reference PSF of a second UDC system without a display structure; and
   determining a difference between the PSF of the UDC system with the display structure and the reference PSF of the second UDC system without the display structure, wherein the difference is used to compute the metric to evaluate the performance of the display structure.

6. The method of claim 5, wherein the selection criteria comprises the difference between the PSF of the UDC system with the display structure and the reference PSF of the second UDC system without the display structure to be minimal.

7. The method of claim 1, wherein computing the metric comprises:
   computing a modulation transfer function (MTF) of the UDC system with the display structure based on the PSF of the UDC system with the display structure; and determining a smoothness of the MTF of the UDC system with the display structure based on computed MTF, wherein the smoothness of the MTF is used to compute the metric to evaluate the performance of the display structure.

8. An electronic device comprising:
one or more non-transitory computer-readable storage media including instructions; and
one or more processors coupled to the storage media, the one or more processors configured to execute the instructions to:
  access a display structure for manufacturing a display panel for an under-display camera (UDC) system, the display structure comprising a set of unit masks over which display components of the display panel will be arranged;
  compute a point spread function (PSF) of the UDC system with the display structure;
  compute a metric to evaluate performance of the display structure based on the PSF;
  determine that the metric does not satisfy selection criteria for using the display structure for manufacturing the display panel for the UDC system;
  in response to the determination, iteratively optimize the display structure, using an automated searching process, until the metric satisfies the selection criteria; and
  generate, based on the display structure, an optimized display structure responsive to completion of the automated searching process, wherein the optimized display structure is used for manufacturing the display panel for the UDC system.

9. The electronic device of claim 8, wherein the instructions to access the display structure further comprise instructions to:
  choose a particular shape for the set of unit masks of the display structure;
  configure, for each unit mask of the set of unit masks, a set of parameters, wherein the set of parameters for the respective unit mask represents a point in a variable space; and
  generate a set of points corresponding to the set of unit masks of the display structure based on the set of parameters configured for the set of unit masks.

10. The electronic device of claim 9, wherein the set of parameters associated with the respective unit mask comprises a position, a size, and a rotation angle of the respective unit mask.

11. The electronic device of claim 9, wherein the instructions to iteratively optimize the display structure, using the automated searching process, further comprise instructions to:
  (1) compute the metric for a current set of points in the display structure;
  (2) select a subset of the current set of points from the display structure based on the selection criteria;
  (3) generate a subsequent set of points using the selected subset of points;
  (4) update the display structure based on one or more of the selected subset of points or the subsequent set of points; and
  (5) repeat steps (1)-(4) until a stopping condition is reached;
  wherein the optimized display structure is generated responsive to the stopping condition being reached.

12. The electronic device of claim 8, wherein the instructions to compute the metric further comprises instructions to:
  access a reference PSF of a second UDC system without a display structure; and
  determine a difference between the PSF of the UDC system with the display structure and the reference PSF of the second UDC system without the display structure, wherein the difference is used to compute the metric to evaluate the performance of the display structure.

13. The electronic device of claim 12, wherein the selection criteria comprises the difference between the PSF of the UDC system with the display structure and the reference PSF of the second UDC system without the display structure to be minimal.

14. The electronic device of claim 8, wherein the instructions to compute the metric further comprises instructions to:
  compute a modulation transfer function (MTF) of the UDC system with the display structure based on the PSF of the UDC system with the display structure; and
  determining a smoothness of the MTF of the UDC system with the display structure based on computed MTF, wherein the smoothness of the MTF is used to compute the metric to evaluate the performance of the display structure.

15. A non-transitory computer-readable medium comprising instructions that, when executed by one or more processors of an electronic device, cause the one or more processors to:
  access a display structure for manufacturing a display panel for an under-display camera (UDC) system, the display structure comprising a set of unit masks over which display components of the display panel will be arranged;
  compute a point spread function (PSF) of the UDC system with the display structure;
  compute a metric to evaluate performance of the display structure based on the PSF;
  determine that the metric does not satisfy selection criteria for using the display structure for manufacturing the display panel for the UDC system;
  in response to the determination, iteratively optimize the display structure, using an automated searching process, until the metric satisfies the selection criteria; and
  generate, based on the display structure, an optimized display structure responsive to completion of the automated searching process, wherein the optimized display structure is used for manufacturing the display panel for the UDC system.

16. The non-transitory computer-readable medium of claim 15, wherein the instructions to access the display structure further comprise instructions to:
  choose a particular shape for the set of unit masks of the display structure;
  configure, for each unit mask of the set of unit masks, a set of parameters, wherein the set of parameters for the respective unit mask represents a point in a variable space; and
  generate a set of points corresponding to the set of unit masks of the display structure based on the set of parameters configured for the set of unit masks.

17. The non-transitory computer-readable medium of claim 16, wherein the instructions to iteratively optimize the display structure, using the automated searching process, further comprise instructions to:

(1) compute the metric for a current set of points in the display structure;
(2) select a subset of the current set of points from the display structure based on the selection criteria;
(3) generate a subsequent set of points using the selected subset of points;
(4) update the display structure based on one or more of the selected subset of points or the subsequent set of points; and
(5) repeat steps (1)-(4) until a stopping condition is reached;

wherein the optimized display structure is generated responsive to the stopping condition being reached.

18. The non-transitory computer-readable medium of claim 15, wherein the instructions to compute the metric further comprises instructions to:

access a reference PSF of a second UDC system without a display structure; and determine a difference between the PSF of the UDC system with the display structure and the reference PSF of the second UDC system without the display structure, wherein the difference is used to compute the metric to evaluate the performance of the display structure.

19. The non-transitory computer-readable medium of claim 18, wherein the selection criteria comprises the difference between the PSF of the UDC system with the display structure and the reference PSF of the second UDC system without the display structure to be minimal.

20. The non-transitory computer-readable medium of claim 15, wherein the instructions to compute the metric further comprises instructions to:

compute a modulation transfer function (MTF) of the UDC system with the display structure based on the PSF of the UDC system with the display structure; and determine a smoothness of the MTF of the UDC system with the display structure based on computed MTF, wherein the smoothness of the MTF is used to compute the metric to evaluate the performance of the display structure.

* * * * *